(12) United States Patent
Chao et al.

(10) Patent No.: US 7,554,099 B2
(45) Date of Patent: Jun. 30, 2009

(54) ULTRA-THIN LIQUID CONTROL PLATE AND COMBINATION OF BOX-LIKE MEMBER AND THE CONTROL PLATE

(75) Inventors: Chih-Yu Chao, Taipei (TW); Wen-Jiunn Hsieh, Taipei County (TW)

(73) Assignee: Contrel Technology Co., Ltd. (TW)

( * ) Notice: Subject to any disclaimer, the term of this patent is extended or adjusted under 35 U.S.C. 154(b) by 142 days.

(21) Appl. No.: 11/483,765

(22) Filed: Jul. 11, 2006

(65) Prior Publication Data

US 2007/0145268 A1    Jun. 28, 2007

(30) Foreign Application Priority Data

Dec. 9, 2005    (TW) ............................... 94143725 A

(51) Int. Cl.
*G01F 23/00* (2006.01)
*G21K 5/08* (2006.01)
*G21K 5/10* (2006.01)
*G01N 23/00* (2006.01)
*G21K 7/00* (2006.01)

(52) U.S. Cl. ............................ 250/440.11; 250/442.11; 250/306; 250/311; 250/310

(58) Field of Classification Search .............. 250/306, 250/311, 440.11, 442.11, 310
See application file for complete search history.

(56) References Cited

U.S. PATENT DOCUMENTS

| 3,432,275 | A | * | 3/1969 | Unger | 422/102 |
| 5,406,087 | A | * | 4/1995 | Fujiyoshi et al. | 250/440.11 |
| 7,230,242 | B2 | * | 6/2007 | Behar et al. | 250/310 |

FOREIGN PATENT DOCUMENTS

WO    WO/02/45125 A1 *  6/2002

OTHER PUBLICATIONS

"BioTrove Announces OpenArray-TM- Transcription Analysis System; Features Nanoliter High-Density qPCR" Business Wire, Sep. 20, 2004.*

* cited by examiner

*Primary Examiner*—Jack I Berman
*Assistant Examiner*—Brooke Purinton
(74) *Attorney, Agent, or Firm*—Bacon & Thomas, PLLC

(57) ABSTRACT

An ultra-thin liquid control plate and a combination of a box-like member and the control plate include a plate-like member having at least one view hole. The joint surface combined with a sidewall of the view hole and a surface of the plate-like member is provided with at least one more-hydrophilic section and at least one less-hydrophilic section, wherein the more-hydrophilic section has a height smaller than 50 μm. While combined with the box-like member, the plate-like member is mounted in the box-like member. The box-like member has at least one through hole running through each of a top side and a bottom side thereof and coaxially aligned with the view hole. After a liquid is placed into the view hole, the more-hydrophilic section adsorbs the liquid to form a liquid layer and the less-hydrophilic section is hydrophobic to adsorb no liquid.

17 Claims, 25 Drawing Sheets

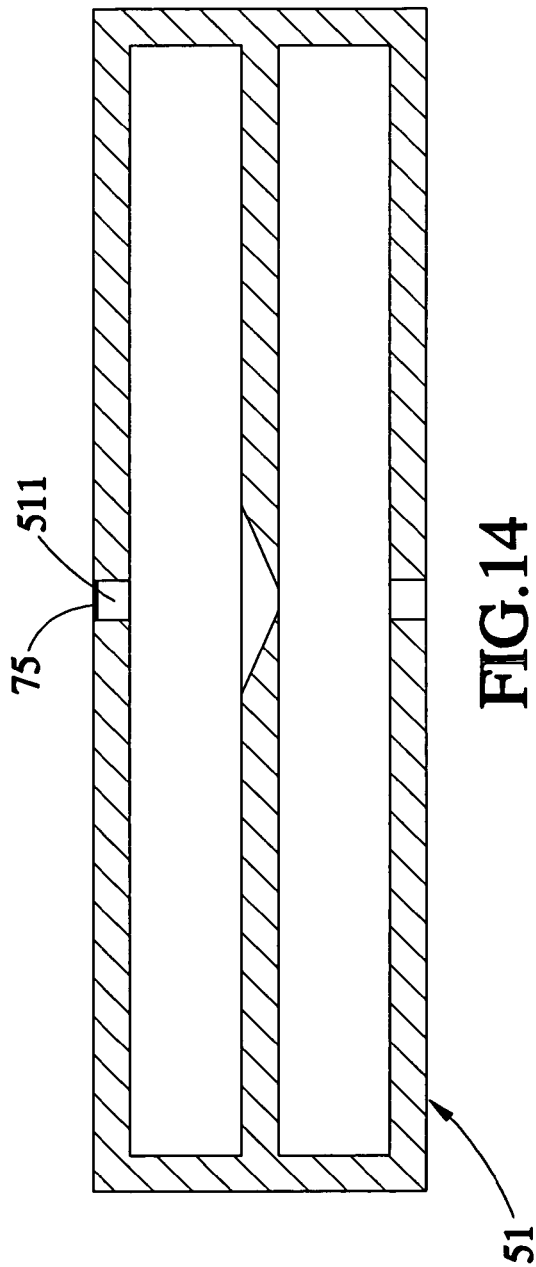
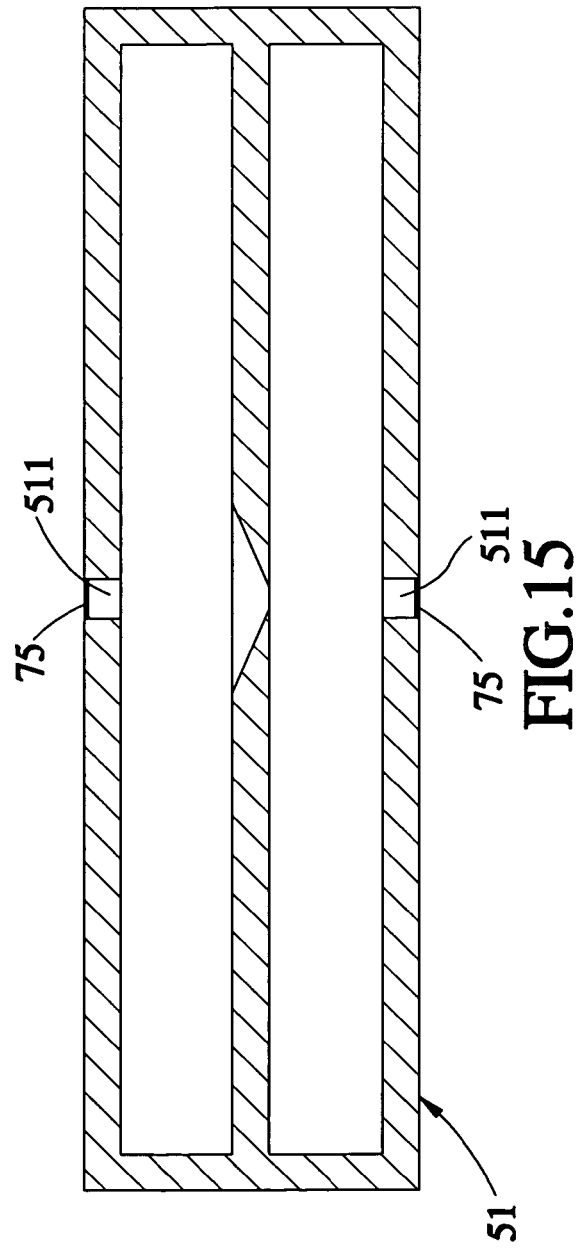

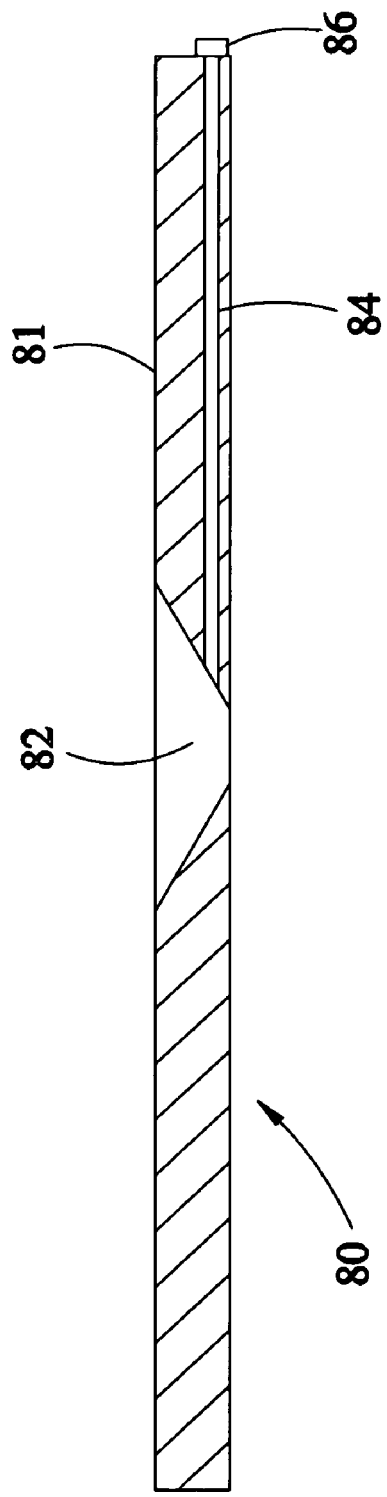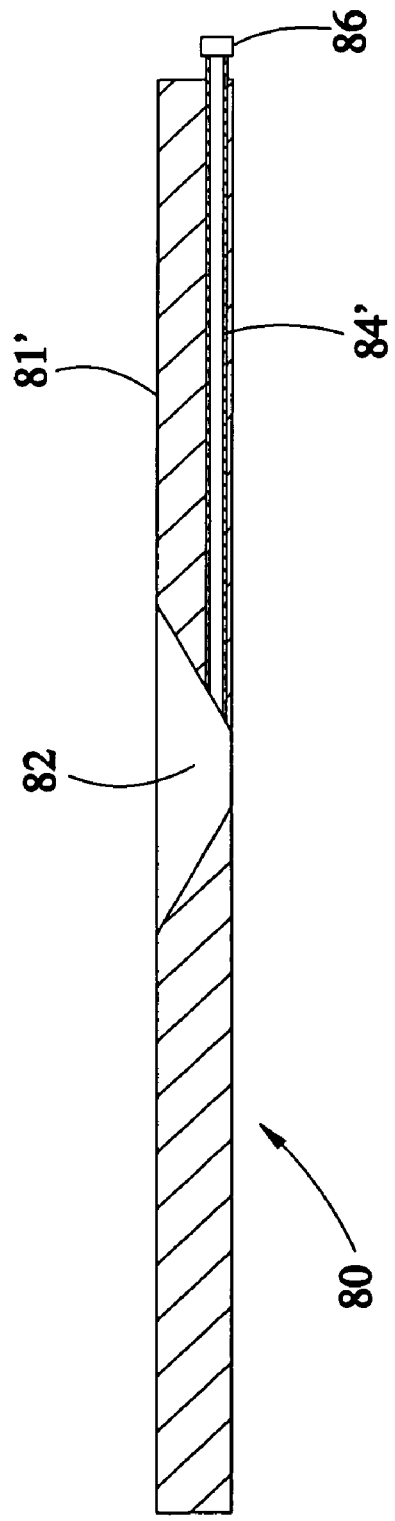

ULTRA-THIN LIQUID CONTROL PLATE AND COMBINATION OF BOX-LIKE MEMBER AND THE CONTROL PLATE

BACKGROUND OF THE INVENTION

1. Field of the Invention

The present invention relates generally to electron microscopes, and more particularly, to an ultra-thin liquid control plate, which keeps an ultra-thin liquid layer in an electron microscope, and a combination of a box-like member and the control plate.

2. Description of the Related Art

According to the prior art, while an electron microscope is operated for observation of an object, the object under observation must be nonvolatile to allow observation of itself because of the limitation of the vacuum environment of a specimen chamber inside the electron microscope. For example, if a liquid or gasiform fluid matter is put into the vacuum specimen chamber, a great amount of gas will be produced to not only disable the penetration of the electron beam through the object for diffraction or imaging experiment but also to influence the vacuum of high-vacuum area, like electron gun of the electron microscope, or incur contamination inside the high-vacuum area to further damage the electron microscope.

Although some people proposed an environment inside the electron microscope for observation of liquid or gas, such as Gai P. L. (Gai P. L., Microscopy & Microanalysis 8, 21, 2002). However, the specimen chamber is subject to the failure of the effective control of the amount of infused liquid. Too much liquid is introduced such that the liquid is too thick to enable the electron beam to penetrate the specimen. In addition, the gas chamber covers the whole space between the upper and lower pole pieces, such that multiple scattering generated by that the electron impinges excessive gas molecules is very serious to disable the electron beam for successful imaging and experiment of electron diffraction. Moreover, such design still has to dismantle the primary part of the microscope first and then install the components into the microscope, such that such design is unlikely for mass production.

As far as I know, there is still nobody who develops any environment that the liquid or an object in the liquid, like live cell, can be clearly observed under the electron microscope.

Now, a solution to the above problem is concluded because I develop an environment for clear observation of the liquid specimen under the microscope. During the operation, it is found that the thickness of the liquid specimen and that of the ambient gas layer must keep ultra-thin. In light of this, the present invention discloses an ultra-thin liquid control plate and a combination of the control plate and a box-like member, in which a liquid layer keeping ultra-thin is formed for receiving solid solutes or live cells and for cooperation with observation under the electron microscope, wherein the liquid layer can be a liquid specimen.

SUMMARY OF THE INVENTION

The primary objective of the present invention is to provide an ultra-thin liquid control plate and a combination of a box-like member and the control plate, in which an ultra-thin liquid layer is formed for cooperation with observation under an electron microscope.

The secondary objective of the present invention is to provide an ultra-thin liquid control plate and a combination of a box-like member and the control plate, which includes a plate-like member, a view hole formed on the plate-like member, a liquid layer formed in the view hole, and a box-like member covering the plate-like member to form a gas-controlling environment around the ultra-thin liquid control plate for cooperation with the observation under the electron microscope.

The foregoing objectives of the present invention are attained by the ultra-thin liquid control plate, which includes a plate-like member having at least one view hole. The joint surface combined with a sidewall of the view hole and a surface of the plate-like member is provided with at least one more-hydrophilic section and at least one less-hydrophilic section. The more-hydrophilic section has a height smaller than 50 µm. After the liquid is placed into the view hole, the more-hydrophilic section adsorbs the liquid to form an ultra-thin liquid layer and the less-hydrophilic section is less hydrophilic to adsorb none of the liquid.

While the ultra-thin liquid control plate is combined with a box-like member, the control plate is mounted inside the box-like member. The box-like member has at least one through hole formed on each of a top side and a bottom side thereof and coaxially aligned with the view hole.

Therefore, the present invention provides a plate-like member much subject to formation of an ultra-thin liquid layer for observation under the electron microscope.

BRIEF DESCRIPTION OF THE DRAWINGS

FIG. 14 is another sectional view of the fourth preferred embodiment of the present invention, showing that a film is mounted to the through hole.

FIG. 15 is another sectional view of the fourth preferred embodiment of the present invention, showing that two films are mounted to the through holes respectively.

FIG. 16 is a schematic view of a fifth preferred embodiment of the present invention.

FIG. 17 is another schematic view of the fifth preferred embodiment of the present invention.

DETAILED DESCRIPTION OF PREFERRED EMBODIMENTS

Figure 1:
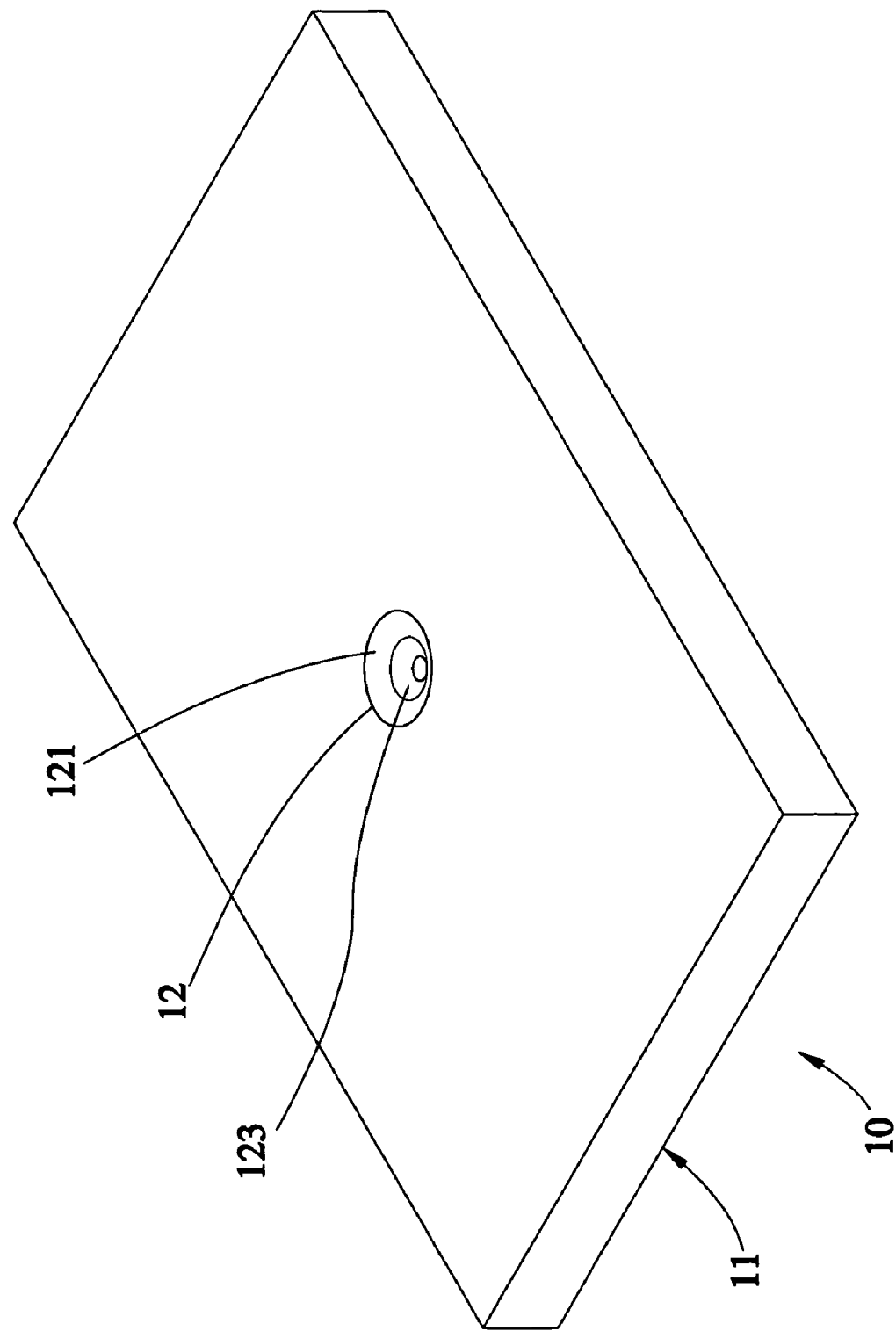
FIG. 1 is a perspective view of a first preferred embodiment of the present invention.

It is to be noted that the hydrophilic and hydrophobic materials and the thickness of the liquid layer are shown with larger proportions than their actual ones in the drawings to more clarify the present invention.

Figure 2:
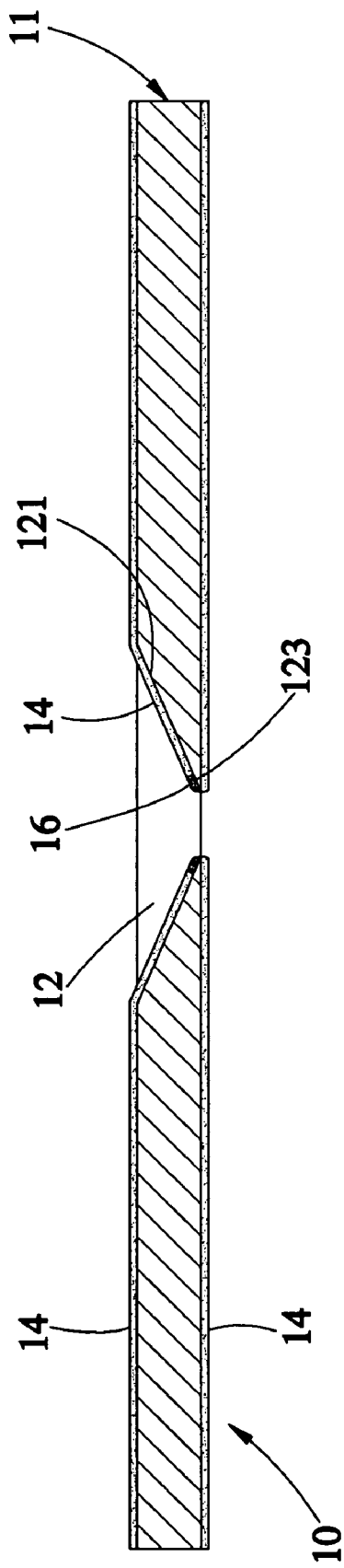
FIG. 2 is a sectional view of the first preferred embodiment of the present invention.
Figure 3:
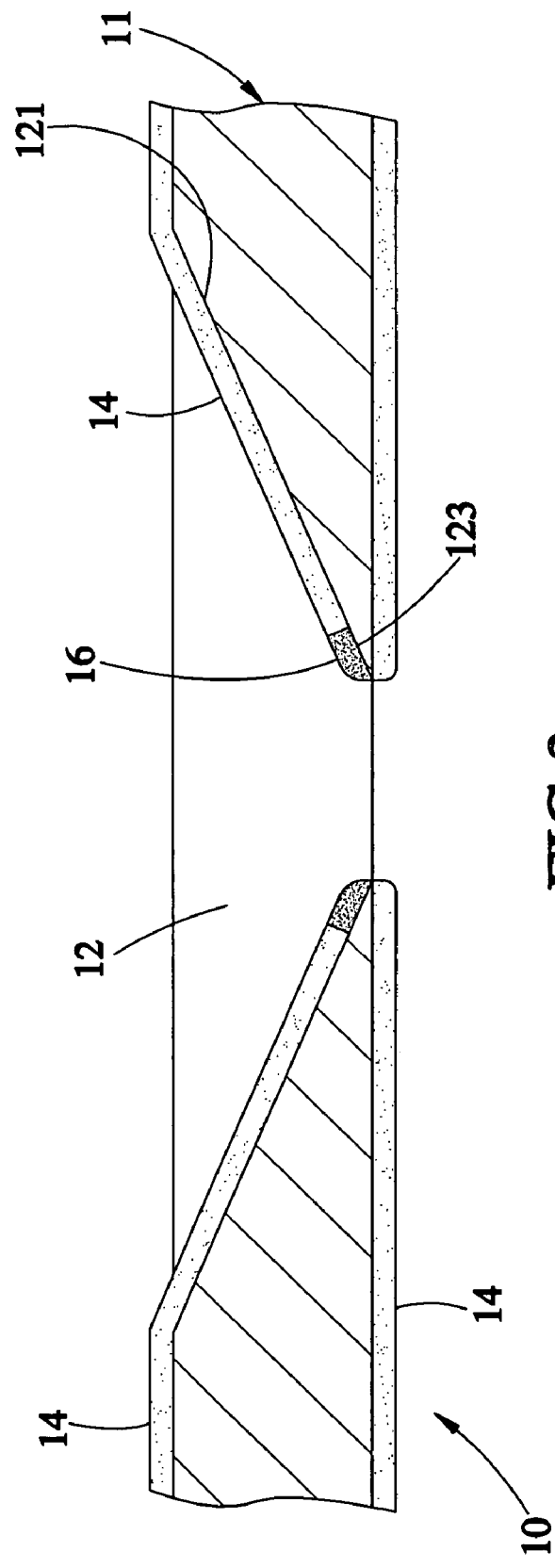
FIG. 3 is an enlarged sectional view of the first preferred embodiment of the present invention.

Referring to FIGS. 1-3, an ultra-thin liquid control plate 10 includes a plate-like member 11 having at least one view hole 12. The sidewall of the view hole 12 is taper-shaped to have a large diameter and a small diameter at a top end thereof and at a bottom end respectively, having an upper section 121 and a lower section 123 which abut the top and bottom ends respectively. The upper section 121 is coated with a hydrophobic layer 14 to be less hydrophilic. The lower section 123 is coated with a hydrophilic layer 16 to be more hydrophilic, having a height smaller than 50 µm, wherein 20 µm is preferable for its height. The view hole 12 has a diameter smaller than 500 µm, wherein the small-diameter end of the view hole 12 has a diameter of 50 µm. In addition, two end surfaces of the plate-like member 11 are hydrophobic and become much more hydrophobic, i.e. less hydrophilic, because of a hydrophobic layer coated thereon.

Figure 4:
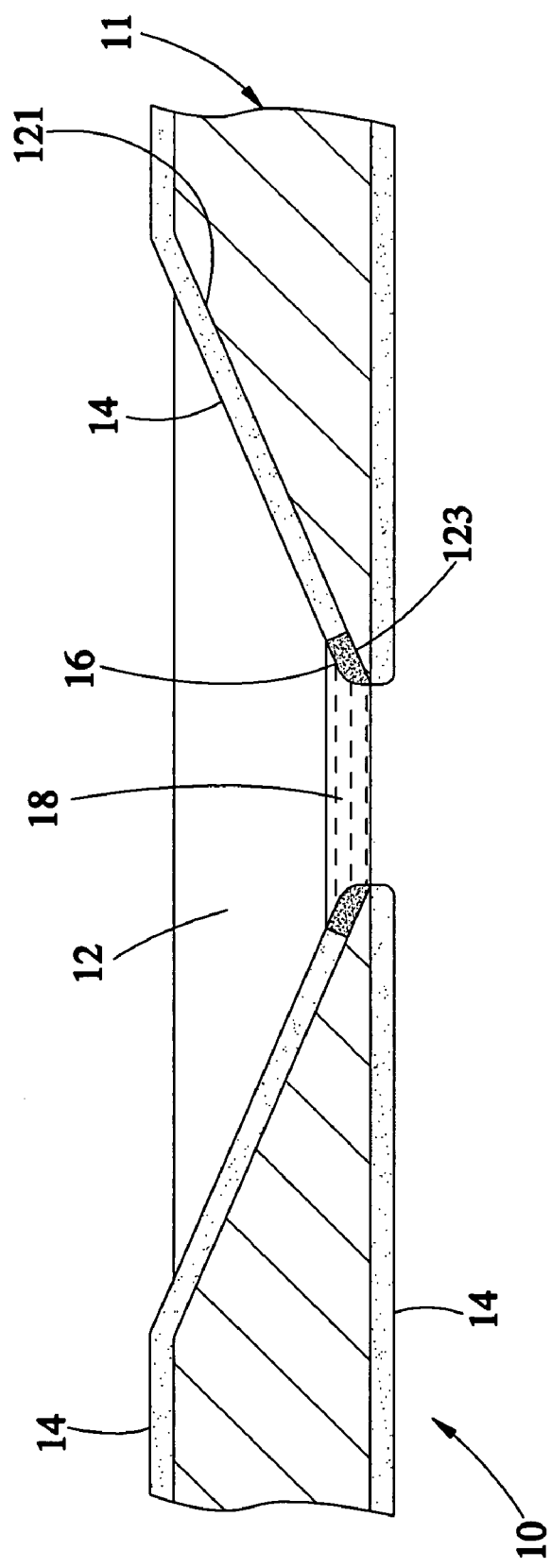
FIG. 4 is similar to FIG. 3, showing that the ultra-thin liquid layer is formed.

While hydrophobic or super-hydrophobic treatment is conducted, several pillars, each of which diameter is defined within hundreds of nanometers, are manufactured and a self-assembly monomolecular layer is adhered onto a surface of each of the pillars to enable a contact angle of any water drop on the surface of the pillar to be larger than 150 degrees, enabling the treated surface become super-hydrophobic, i.e. the surface will not become wet incurred by the water. The surface can also be treated to be super-hydrophobic by means of any other conventional super-hydrophobic process. One of methods of placing the liquid into the view hole can done by spreading or wiping a water film on the plate-like member 11, or soaking the plate-like member 11 into the water and taking it out of the water. Because the two end surfaces of the plate-like member 11 are hydrophobic or super-hydrophobic and the upper section 121 of the view hole 12 is hydrophobic or super-hydrophobic, a liquid water layer is formed at the hydrophilic lower section 123 only other than at the hydrophobic sidewall 121 of the view hole 12, thus forming an ultra-thin water layer at the lower section 123 of the view hole 12, as shown in FIG. 4. The liquid layer 18 as an ultra-thin water layer of a height smaller than 50 µm is about as high as the lower section 123.

Figure 5:
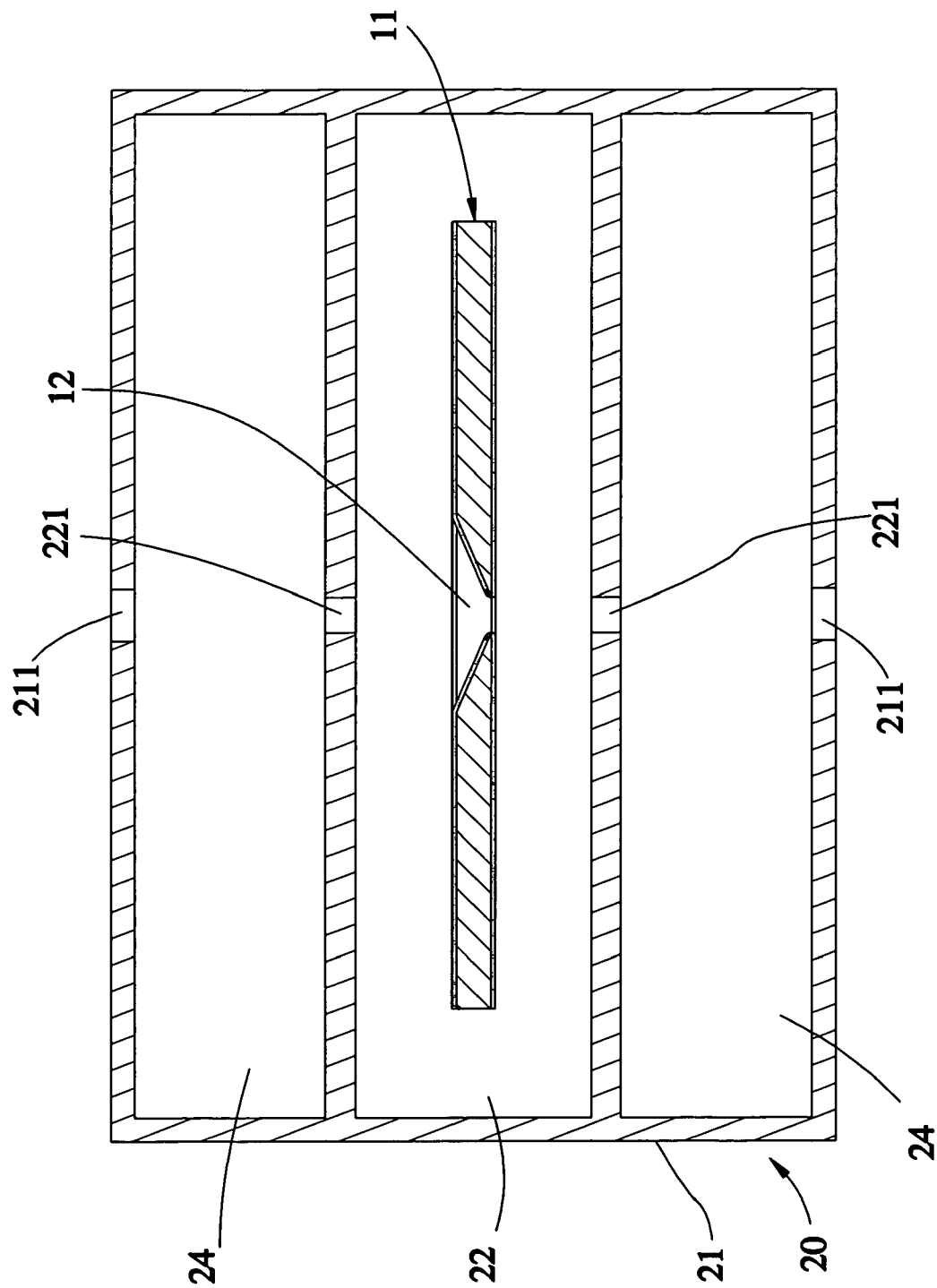
FIG. 5 is a sectional view of the first preferred embodiment of the present invention in operation.

While the observation of the plate-like member 11 under the microscope is intended, the liquid layer can be formed in the view hole 12, containing a cell specimen, like live cell and cell nutrient fluid, and then placed into an observational environment 20 for observation, wherein the live cell and its nutrient fluid can be fixed and adsorbed to the lower section 123 of the view hole 12. FIG. 5 illustrates the status of the observational environment 20 that the plate-like member 11 is placed. The observational environment 20 can be a housing 21 having a gas chamber 22 therein, two buffer chambers 24 located above and below the gas chamber 22 respectively, two gas apertures 221 formed between the gas chamber 22 and the two buffer chambers 24 respectively and communicating with each other, and two outer apertures 211 formed therethrough for communication between the two buffer chambers 23 and outside. The plate-like member 11 is placed inside the observational environment 20. The view hole 12, the two gas apertures 221, and the two outer apertures 211 are coaxially aligned.

In operation, firstly, supply the gas chamber 22 with vapor of a predetermined pressure, like an admixture of saturated or unsaturated water vapor and a given gas of one atmospheric pressure in total. The given gas can be nitrogen, oxygen, carbon dioxide, or an inert gas. The water vapor inside the gas chamber 22 can refrain the evaporation of the water on the plate-like member. Secondly, keep pumping out the buffer chambers 24 to pump out the vapor and gas escaping from the gas chamber 22 into the two buffer chambers 24 and thus to prevent them from escaping out of the housing 21 into the microscope. Hence, the electron beam (not shown) of the electron microscope can successfully pass through the outer apertures 211, the gas apertures 221, and the view hole 12 to enable the observation of the water layer and the specimen inside the view hole.

The plate-like member 11 can be manufactured by means of microlithography, laser micromachining, or mechanical micromachining. While coating the hydrophilic or hydrophobic material 14 to form an interface having different hydrophilic degrees is intended, paint the whole plate-like member 11 with the hydrophobic material 14 first and then paint a predetermined hydrophilic part of the plate-like member 11 with the hydrophilic material 16.

Figure 6:
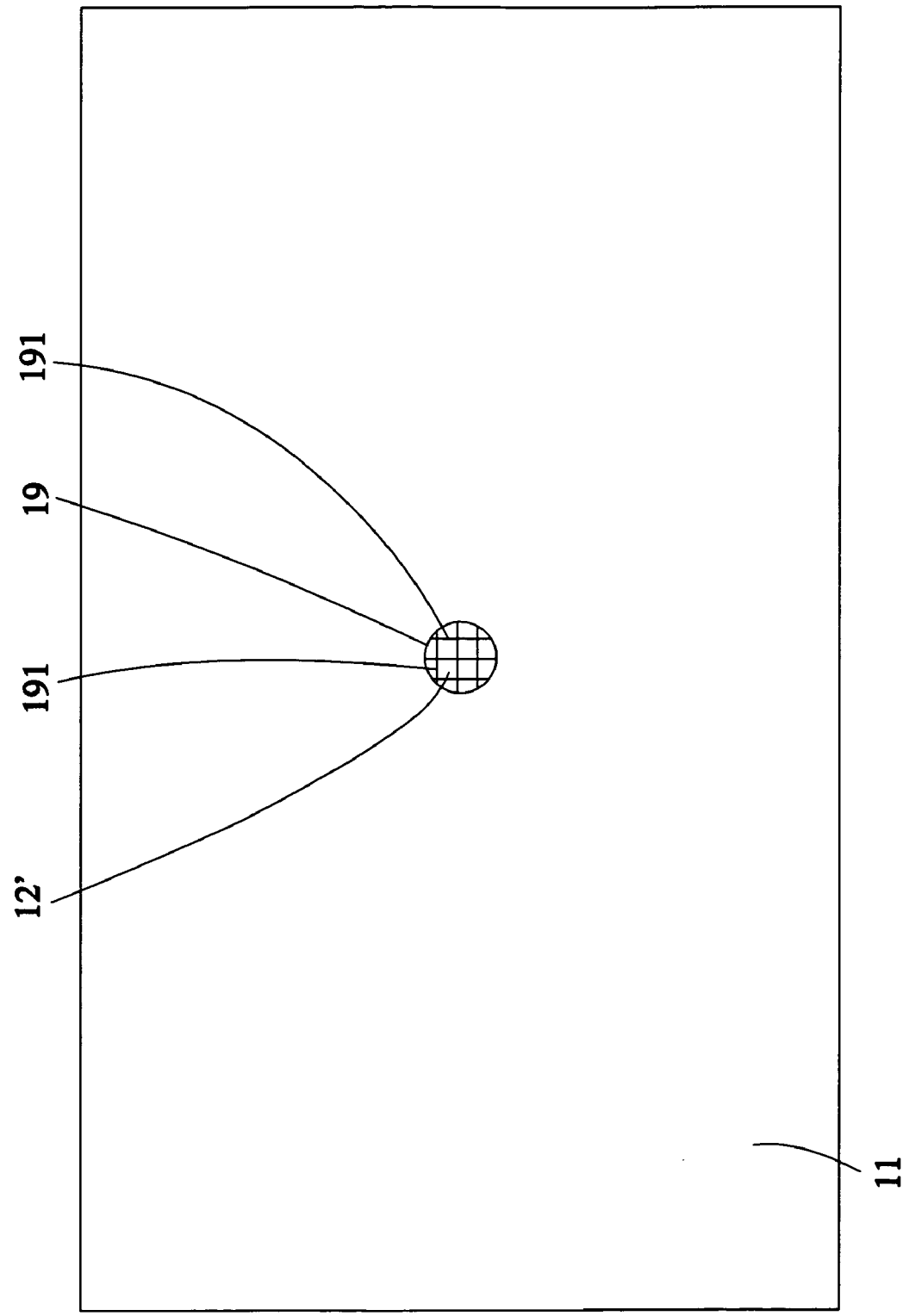
FIG. 6 is a sectional view of the first preferred embodiment of the present invention in operation, showing an alternative view hole.

The view hole 12 can be alternatively formed as shown in FIG. 6. Form a relatively larger hole 19 on the plate-like member 11 and then mount a plurality of ribbings 191 crossed with one another in the relatively larger hole 19 to form a plurality of meshes. Each of the meshes can be acted as a view hole 12'. Further, a general specimen can alternatively be fixed onto the meshes of the relatively larger hole 19 for observation.

Figure 7:
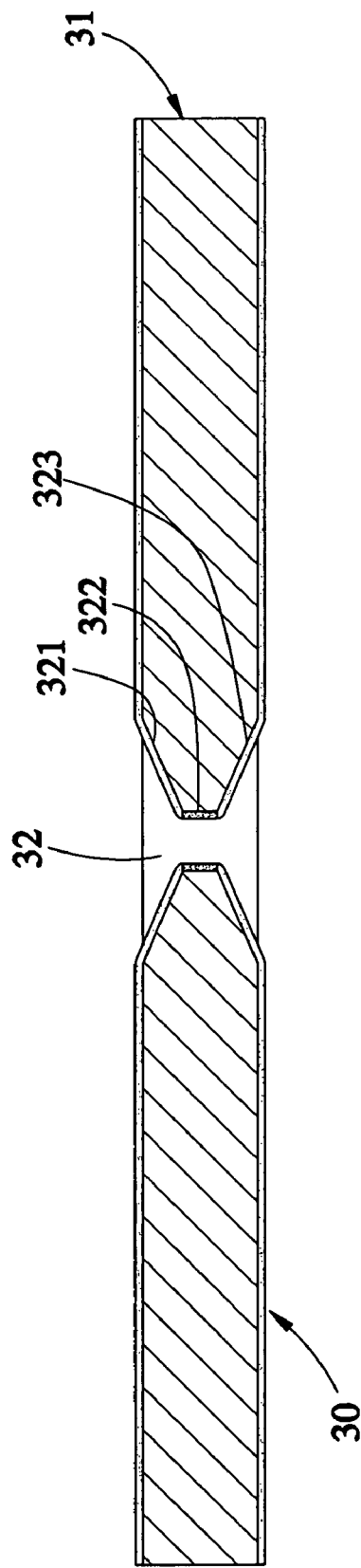
FIG. 7 is a sectional view of a second preferred embodiment of the present invention.

Referring to FIG. 7, an ultra-thin liquid control plate 30 constructed according to a second preferred embodiment of the present invention is similar to the first embodiment, but having difference as recited below.

The sidewall of the view hole of the plate-like member 31 is provided with an upper section 321, a middle section 322, and a lower section 323. The middle section 322 is made of hydrophilic material and the upper and lower sections 321 and 323 are made of hydrophobic material, such that the middle section 322 is more hydrophilic than the upper and lower sections 321 and 323. In other words, the second preferred embodiment has one more hydrophobic section of the sidewall than the first preferred embodiment. In this embodiment, each of the upper and lower sections 321 and 323 is tapered-shaped and the middle section 322 is column-shaped, wherein the upper section 321 has a diameter increasingly enlarging from a bottom end thereof to a top end thereof, the lower section 323 has a diameter increasingly enlarging from a top end thereof to a bottom end thereof, and the middle section 322 has a constant diameter. The view hole 32 is hourglass-shaped to enable the top end of the upper section 321 and the bottom end of the lower section 323 each to be larger in diameter than the middle section 322.

Figure 8:
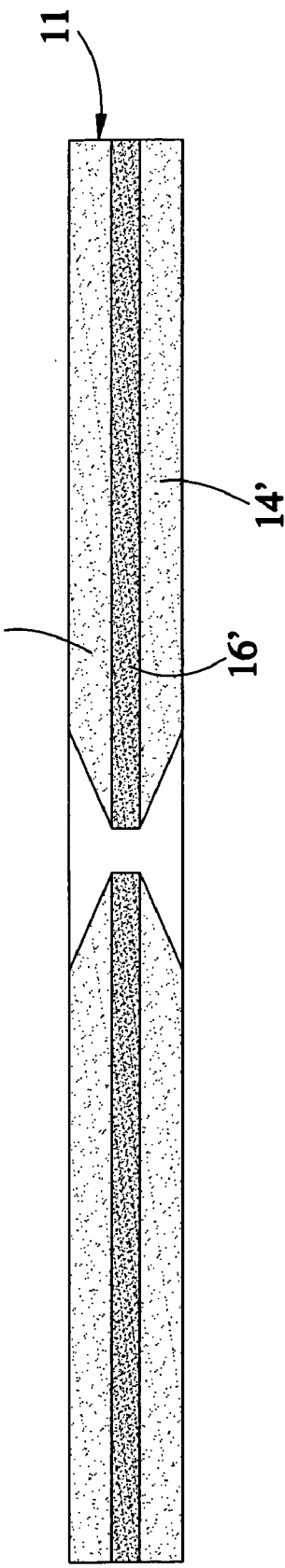
FIG. 8 is similar to FIG. 7, showing an alternative plate-like member.

In the second embodiment, the relatively hydrophilic and hydrophobic characteristics of the plate-like member 31 can be alternatively presented. As shown in FIG. 8, the plate-like member 11 is formed of a hydrophilic layer 16' and two hydrophobic layers 14', wherein the hydrophilic layer 16' is tightly mounted between the two hydrophobic layers 14'. The hydrophilic layer 16' is made of hydrophilic material and the two hydrophobic layers 14' are made of hydrophobic material to be less hydrophilic, such that an interface of different hydrophilic degrees is formed on the plate-like member 11 to have the same effect as the plate-like member 31 shown in FIG. 7. The plate-like member 11 can be produced by film coating/deposition technique in cooperation with microlithography or laser micromachining.

The liquid layer of the second embodiment is formed in the same manner and by the same operation as the first embodiment and thus no further recitation is necessary.

Figure 9:
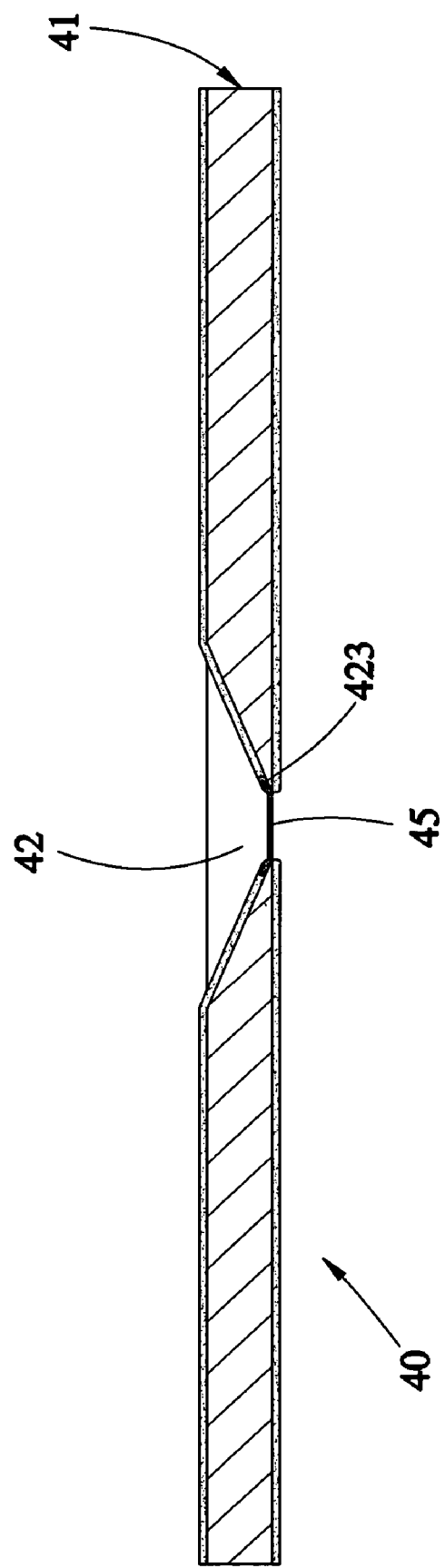
FIG. 9 is a sectional view of a third preferred embodiment of the present invention.

Referring to FIG. 9, an ultra-thin liquid control plate 40 constructed according to a third preferred embodiment of the present invention is similar to the first embodiment, but having difference as recited below.

The plate-like member 41 includes a film 45, like amorphous carbon film, mounted at a bottom end of the lower section 423 of the view hole 42. Because the film 45 is ultra-thin, having a thickness of 20-100 nm, the resolution of electron microscope will not be affected by diffuse electron scattering caused by the film. Hydrophilic treatment can be done on a surface of the film 45 to facilitate the formation of ultra-thin water layer on the film 45. In addition, the surface of the film 45 can be coated with a cell fixative to enable the cell specimen to be fixed thereon.

The liquid layer of the first embodiment is formed in the same manner and by the same operation as the first embodiment and thus no further recitation is necessary.

Figure 10:
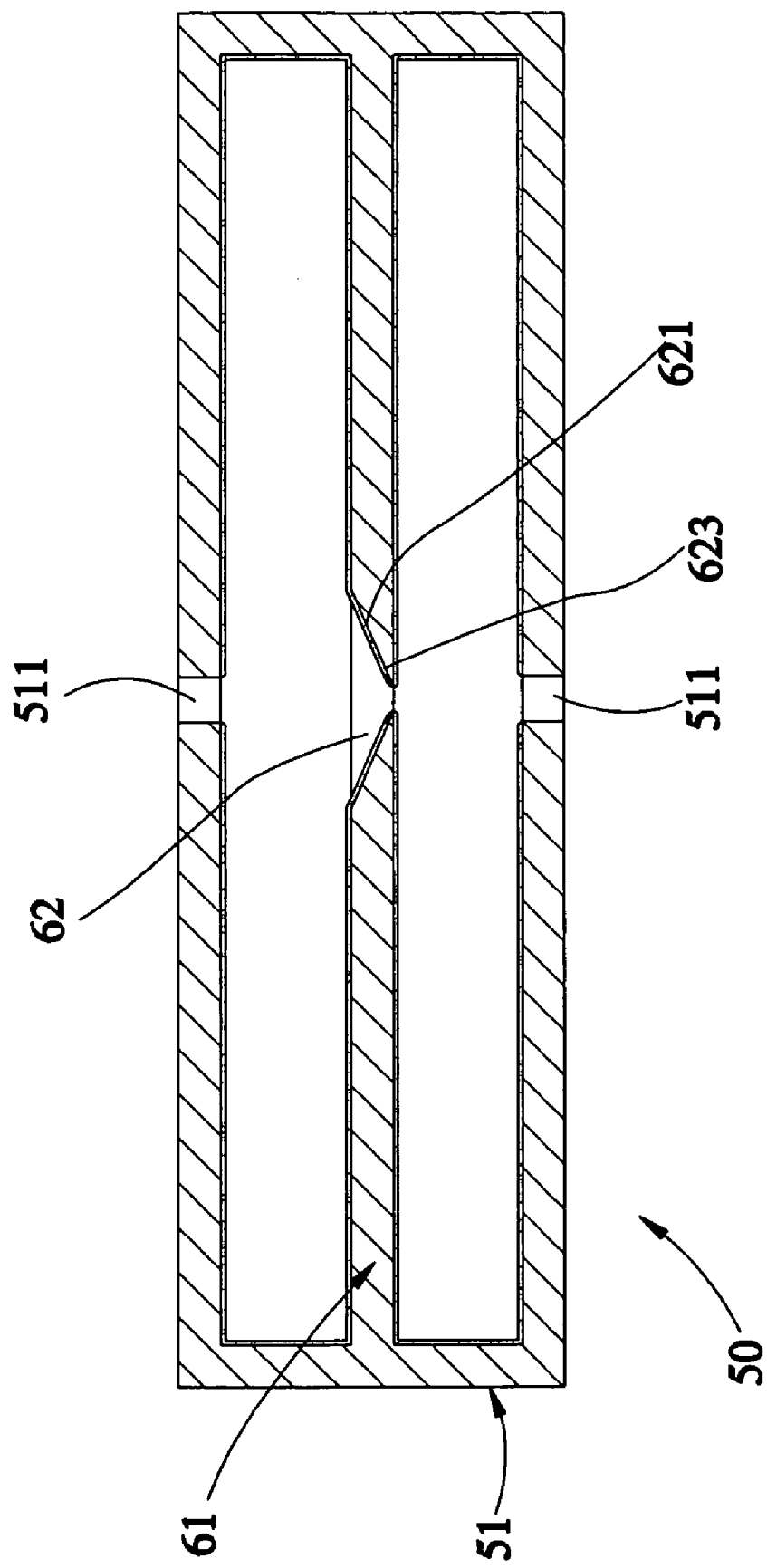
FIG. 10 is a sectional view of a fourth preferred embodiment of the present invention.
Figure 11:
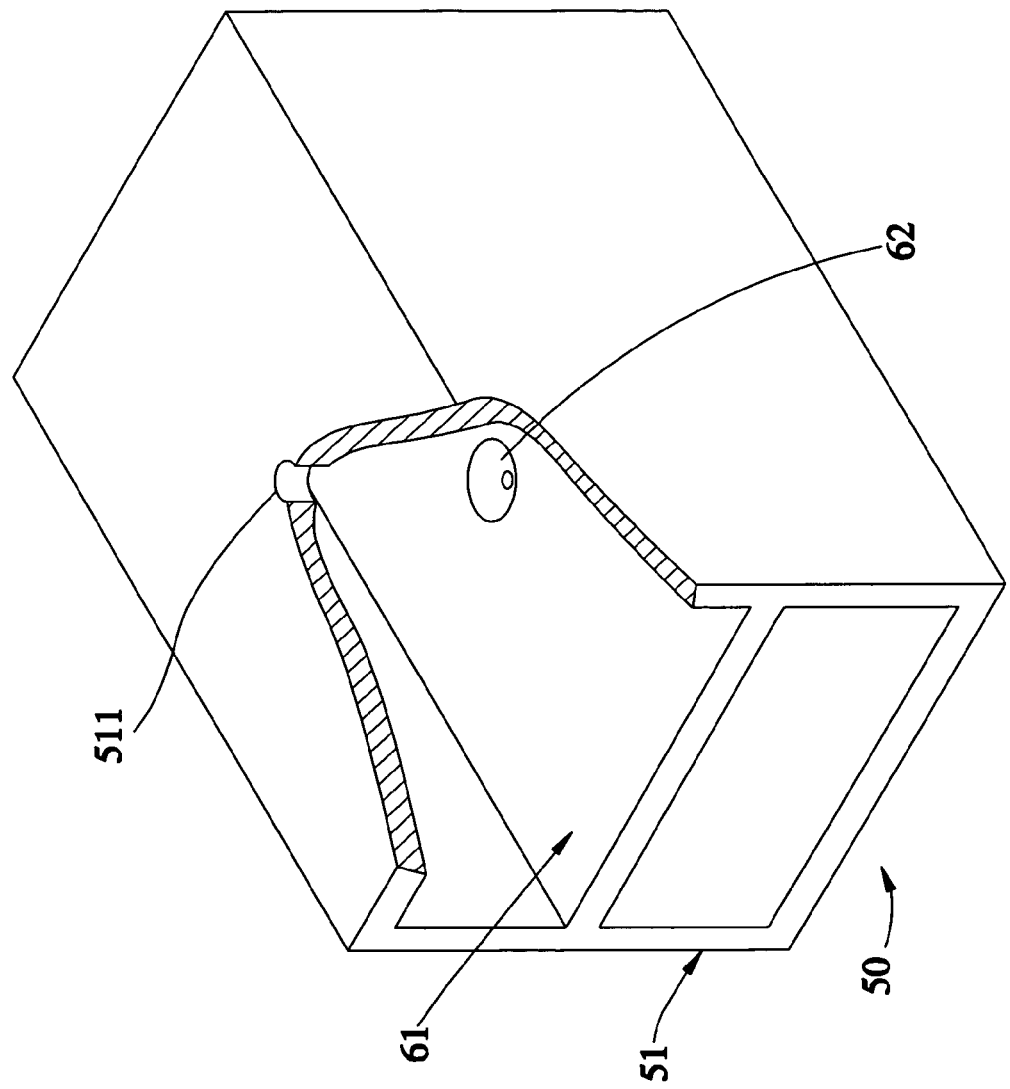
FIG. 11 is a partially sectional perspective view of the fourth preferred embodiment of the present invention.

Referring to FIGS. 10 and 11, an ultra-thin liquid control plate 50 constructed according to a fourth preferred embodiment of the present invention is composed of a box-like member 51 and a plate-like member 61.

The box-like member 51 includes at least two through holes 511 running through a top side thereof and a bottom side thereof respectively.

The plate-like member 61 is received in the box-like member 51 and located at a midsection of the box-like member 51, including at least one view hole 62. The sidewall of the view hole 62 has an upper section 621 and a lower section 623 located below the upper section 621. The upper section 621 treated to be less hydrophilic. The lower section 623 is treated to be more hydrophilic. The hydrophilic section 623 is smaller than 50 μm in thickness. Surfaces of a top side and a bottom side of the plate-like member 61 are treated to be hydrophobic. The through holes 511 and the view hole 62 are coaxially aligned.

While the fourth embodiment is in use, it is similar to the first embodiment. The inside space of the box-like member 51 can be acted as the gas chamber 22 of the first embodiment and at least one buffer chamber can be mounted above or below the inside space of the box-like member 51, thus enabling the fourth embodiment to be operated in the same manner as the first embodiment.

Figure 12:
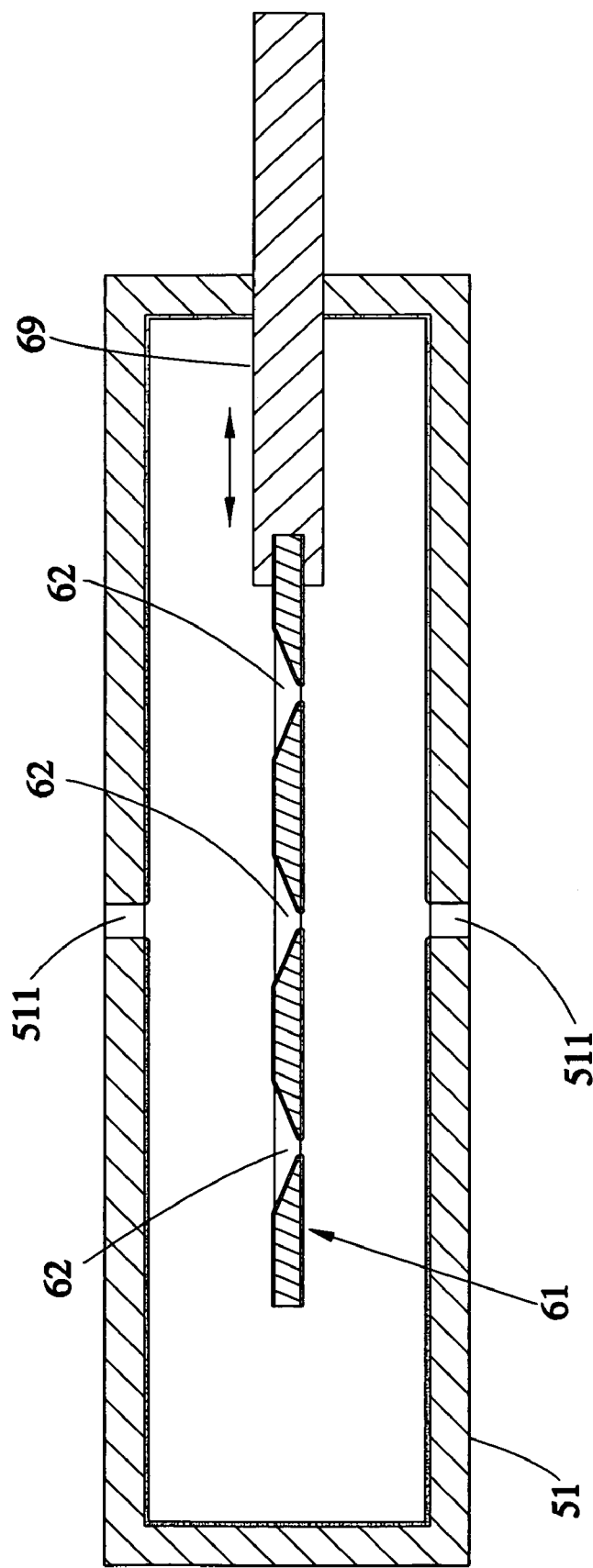
FIG. 12 is a sectional view of the fourth preferred embodiment of the present invention, showing that the plate-like member is separated from the box-like member.

The view hole 62 of the fourth embodiment is more than one. As shown in FIG. 12, a plurality of view holes 62 are mounted on the plate-like member 61. The plate-like member 61 is separated from the box-like member 51 and is held by a holder 69 to be controllably movable inside the box-like member 51. In light of this, while the observation under the electron microscope is intended, the user can pick one of the view holes 62 and move it to the position coaxially corresponding to the through holes 511 for the observation. Thus, the observation can be done through multiple view holes 62. In addition, the general specimen can be fixed onto the plate-like member 61 and placed into the box-like member 51 for observation.

Figure 13:
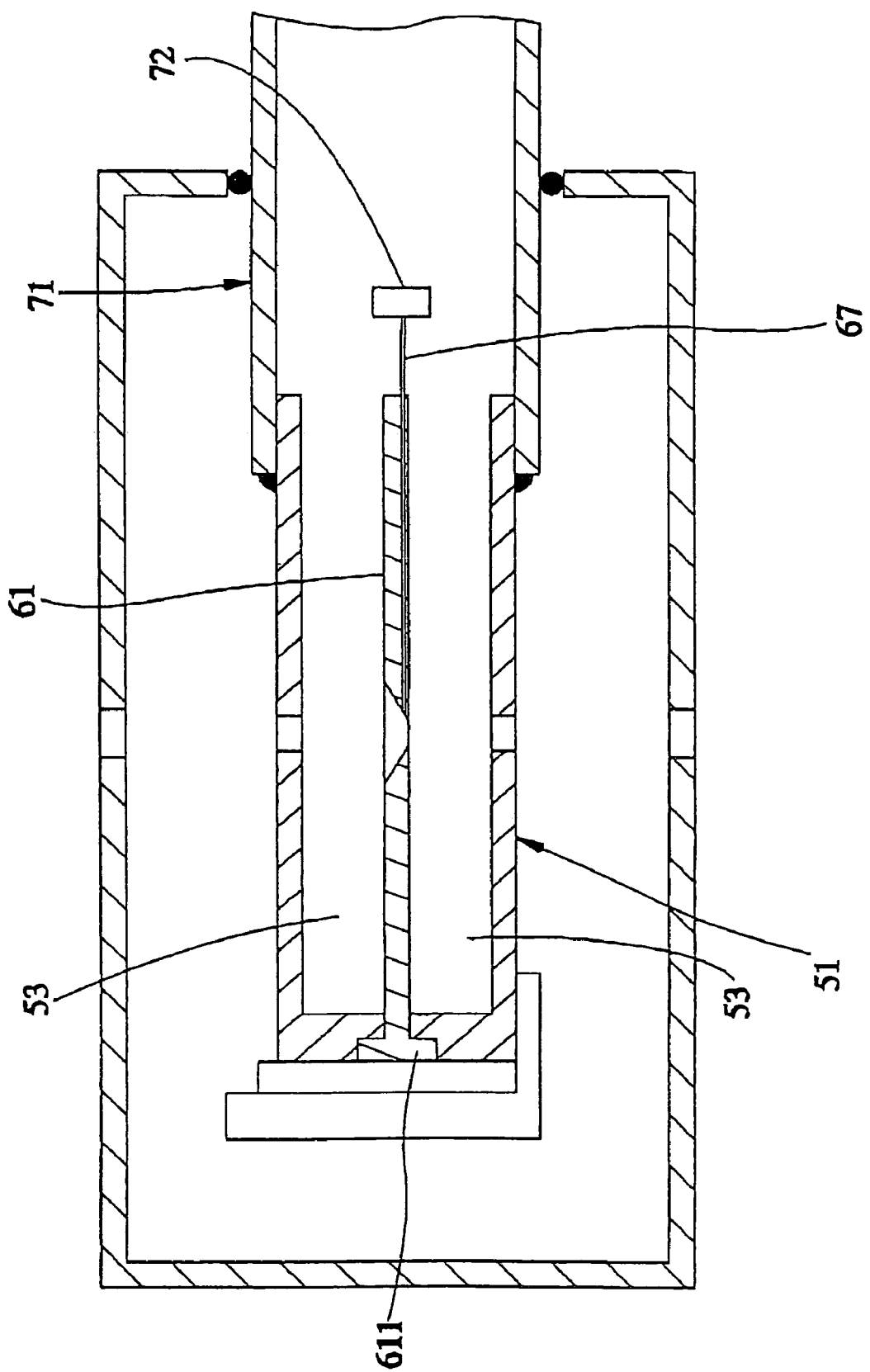
FIG. 13 is another sectional view of the fourth preferred embodiment of the present invention, showing that the box-like member is combined with a specimen holder.

Alternatively, the specimen holder 71 can be applied to the fourth embodiment of the present invention. As shown in FIG. 13, the plate-like member 61 includes at least one liquid control tubing 67 in communication with the view hole 62 and corresponding to the hydrophilic lower section 623 of the sidewall of the view hole 62 for infusing water into or pumping out water from the view hole 62 and thus controlling the amount and pressure of the water inside the view hole 62, or for infilling the live cell and the liquid specimen or any substance dissolved into the liquid specimen. The box-like member 51 has one side in communication with the specimen holder 71 for control of the gas. The specimen holder 71 can alternatively be mounted with a liquid control device 72 therein in communication with the liquid control tubing 67 for control of the liquid.

The plate-like member 61 can alternatively made by the microlithography and mounted inside the box-like member 51, or fixedly mounted inside the box-like member 51 with a stop 611 after the specimen is placed onto the plate-like member 61, as shown in FIG. 13. The box-like member 51 can be also made by the microlithography. An ultra-thin gas chamber 53 is formed inside the box-like member 51 to reduce the multiple scattering of the electron beam passing through the gas chamber 53.

Moreover, a plurality of groups of the through holes and the view hole coaxially aligned can be provided on the plate-like and box-like members 61 and 51 and the whole box-like member 51 can be held by the specimen holder 71 to be movable together with the specimen holder 71 for multi-positional observation as identical to the operation shown in FIG. 12 and thus no further recitation is necessary.

In addition, in the fourth embodiment, the box-like member 51 can alternatively include a film 75 mounted to the through hole 511 located on the top side thereof for sealing the through hole 511, as shown in FIG. 14. The box-like member 51 can alternatively include two films 75 mounted to the through holes 511 located on the top and bottom sides thereof for sealing the through holes 511 respectively, as shown in FIG. 15. Because the film 75 is ultra-thin, it does not cause any adverse influence on the penetration of the electron beam of the electron microscope. The film 75 can also directly stop the vapor or gas from escaping through the through hole 511. Thus, it is unnecessary to install the buffer chamber.

Referring to FIGS. 16 and 17, an ultra-thin liquid control plate 80 constructed according to a fifth preferred embodiment of the present invention is composed of a plate-like member 81 and a liquid control tubing 84. The plate-like member 81 includes a view hole 82. The liquid control tubing 84 has two ends in communication with the view hole 82 and externally connected with a liquid source 86 respectively. The view hole 82 has a diameter smaller than 500 μm. The liquid control tubing 84 can be either a tunnel formed in the plate-like member 81, as shown in FIG. 16, or a pipe running through the plate-like member 81, as shown in FIG. 17. The liquid source 86 can be a water supplier, a water pump, or a water-pressure regulator for controlling the amount and the pressure of the liquid inside the view hole 82. In addition, the plate-like member 81 can alternatively include two liquid control tubings (not shown) for pumping out and drawing the water and thus conveniently controlling the liquid.

In the fifth embodiment, the water layer can be formed in the view hole 82 by placing (e.g. dropping, spreading, or dipping) the water into the view hole 82 directly; meanwhile, the water is adsorbed onto the sidewall of the view hole 82 and then the liquid source 86 pumps out a part of the water from the view hole 82 through the liquid control tubing 84. The remaining water inside the view hole 82 forms the ultra-thin water layer due to the surface tension. Either one or two liquid control tubings can attain the effect of the control of the water layer. The liquid control tubing 84 can also be directly provided for infusing the water or the live cell and other liquid specimen or substances dissolved into the liquid specimen.

The operation of the fifth embodiment is identical to the first embodiment, such that no further recitation is necessary. As indicated in the fifth embodiment of the present invention, the present invention controls the liquid by, in addition to the different hydrophilic degrees of the sidewall, pumping out the water to form the ultra-thin water layer. Furthermore, the plate-like member of the fifth embodiment can do the same operation as the aforementioned third embodiment with the box-like member and thus no further recitation is necessary.

It is to be noted that the liquid layer can be formed, not limited to the water, of aqueous solution or oil or other alternative liquid.

Figure 18A:
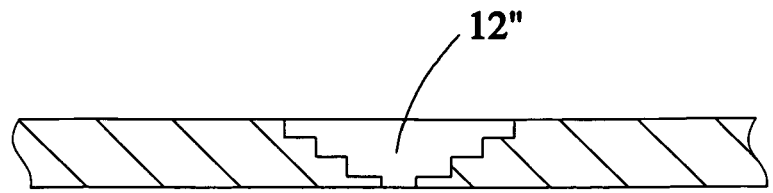
FIGS. 18(A)-18(F) each are a sectional view of the fourth preferred embodiment of the present invention, showing different shapes of the view hole.
Figure 18B:
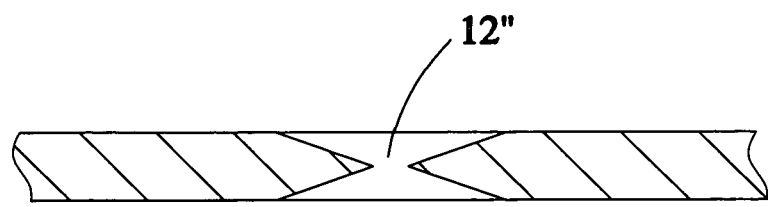
Figure 18C:
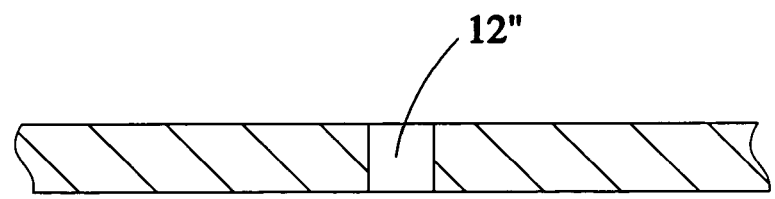
Figure 18D:
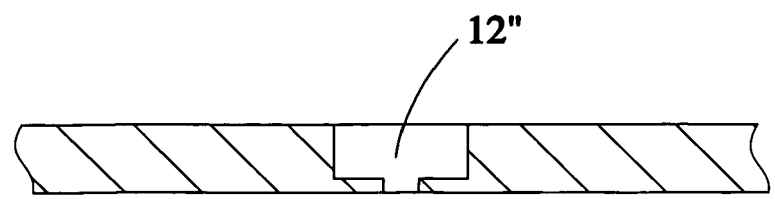
Figure 18E:
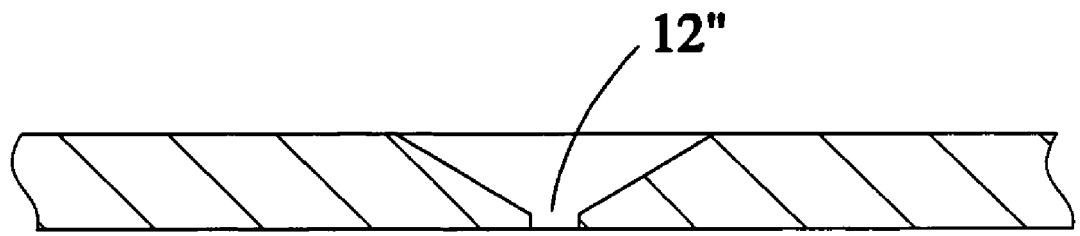
Figure 18F:
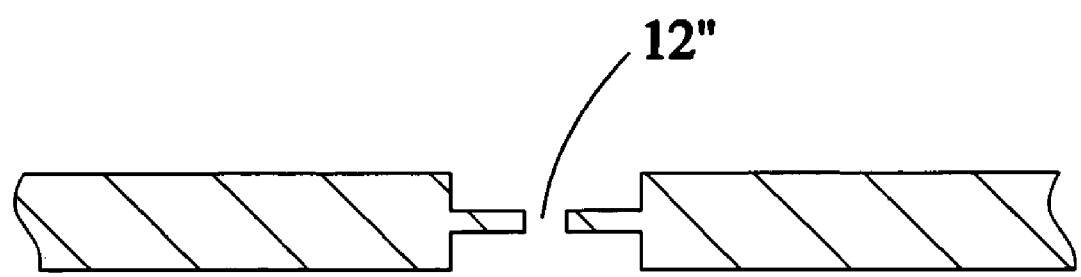

The shape of the sidewall of the view hole 12" is not limited to those of the aforementioned embodiments and can alternatively be stepped in shape to have a diameter decreasing from the top side to the bottom side of the view hole 12" as shown in FIG. 18(A), or be hourglass-shaped to have a narrow midsection of the sidewall as shown in FIG. 18(B), or be column-shaped to have a constant diameter as shown in FIG. 18(C); or the view hole 12" can alternatively has an ultra-thin annular plate formed at the bottom side thereof and having a hollow center as shown in FIG. 18(D); or be funnel-like as shown in FIG. 18(E); or the view hole 12" can alternatively has an ultra-thin annular plate formed at a midsection thereof and having a hollow center as shown in FIG. 18(F). The view hole of the present invention can be any interchangeably shape and not limited to the above-mentioned ones.

Figure 19A:
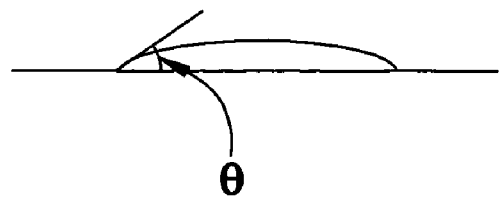
FIGS. 19(A)-19(C) each are a schematic view of the present invention, demonstrating the rationale of hydrophile and hydrophobia.
Figure 19B:
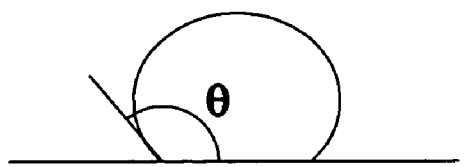
Figure 19C:
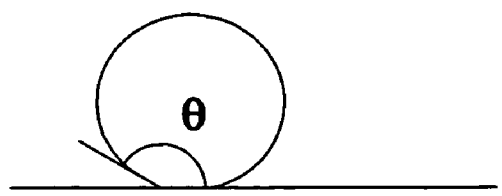

The hydrophilic degree defined in the present invention is based on the angle (critical angle) at which the surface of an object and the margin of a water drop are intersected. As shown in FIG. 19(A), while the critical angle is smaller than 90 degrees, the surface of the object is hydrophilic. As shown in FIG. 19(B), while the critical angle is between 90 and 150 degrees, the surface of the object is hydrophobic. As shown in FIG. 19(C), while the critical angle is larger than 150 degrees, the surface of the object is super-hydrophobic. The difference of hydrophile of the present invention depends on the difference of the critical angle, so that the sidewall of the view hole can be arranged with hydrophile-hydrophobia, hydrophobia-super-hydrophile, hydrophile-super-hydrophobia, or hydrophobia-hydrophobia of different critical angles to enable convenient formation of the liquid layer or other live biological or liquid specimen for observation under the electron microscope.

Figure 20:
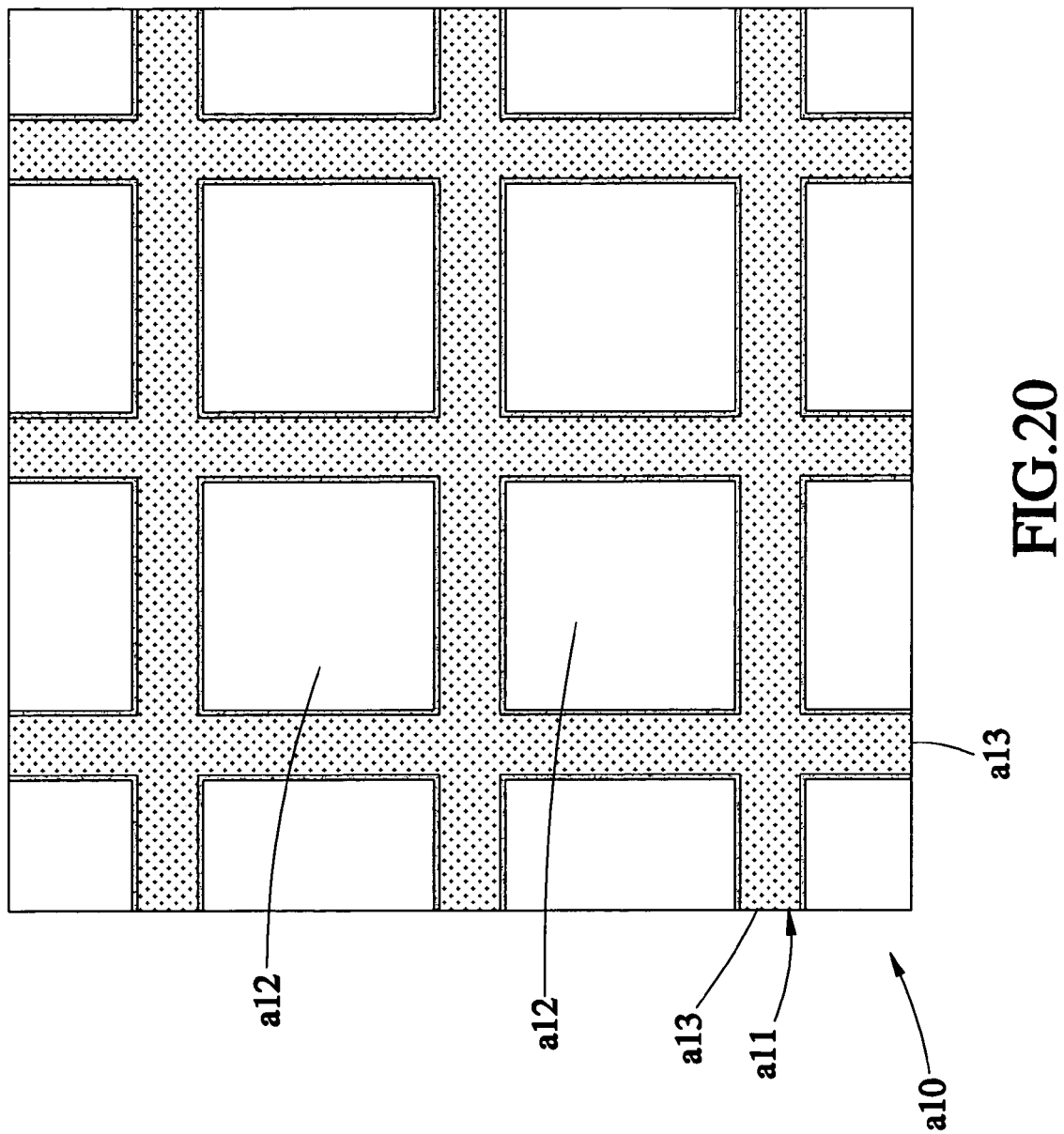
FIG. 20 is a top schematic view of a sixth preferred embodiment of the present invention.
Figure 21:
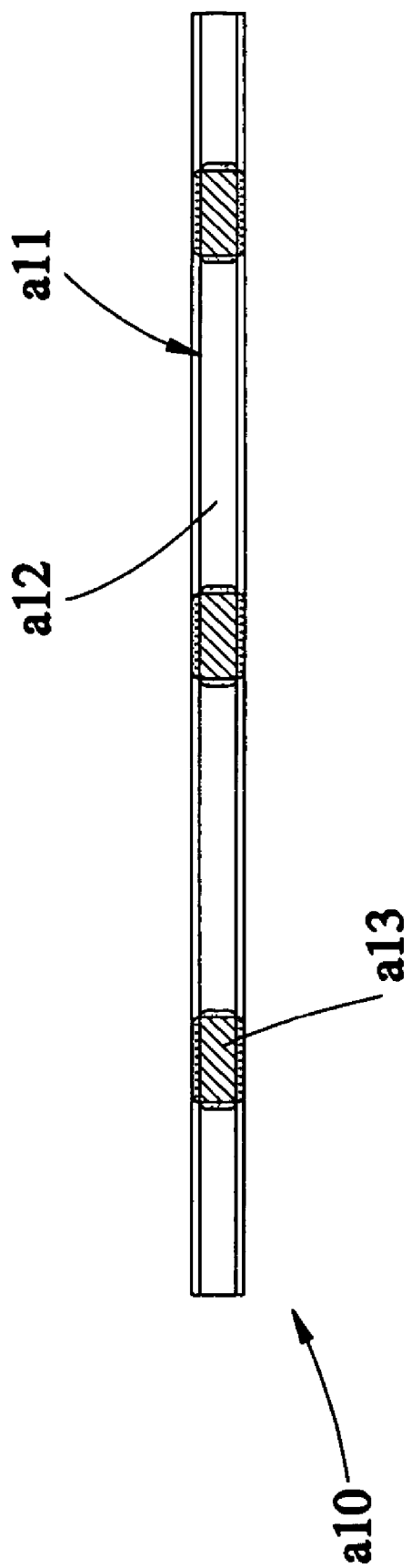
FIG. 21 is a sectional view of the sixth preferred embodiment of the present invention.

Referring to FIGS. 20 and 21, an ultra-thin liquid control plate a10 constructed according to a sixth preferred embodiment of the present invention includes a plate-like member a11. The plate-like member a11 has a plurality of view holes a12, each of which has a hydrophilic sidewall coated with a hydrophilic material, wherein each of hydrophilic parts of the sidewalls of the view holes a12 has a height smaller than 50 μm. The plate-like member a11 is a meshed plate in this embodiment and can be other alternative equivalent, like a plate having a plurality of the view holes disposed in array or randomly. The plate-like member a11 has a plurality of strips a13 intersected with one another to form the view holes a12 thereon, which sidewalls are defined by lateral sides of the strips a13. Top and bottom sides of each of the strips a13 are coated with a hydrophobic or super-hydrophobic material to become hydrophobic or super-hydrophobic.

Thus, an ultra-thin liquid layer is adsorbed onto the sidewalls of the view holes a12 in the sixth embodiment. The other operations of the sixth embodiment, such as adsorption of the liquid layer for cooperation with the operation of the electron microscope, are the same as those of the first embodiment, such that no further recitation is necessary.

In addition, the plate-like member a11 of the sixth embodiment can alternatively be combined with the box-like member as indicated in the fourth embodiment, having the same implementary status as that of the sixth embodiment such that no more description is necessary.

Figure 22:
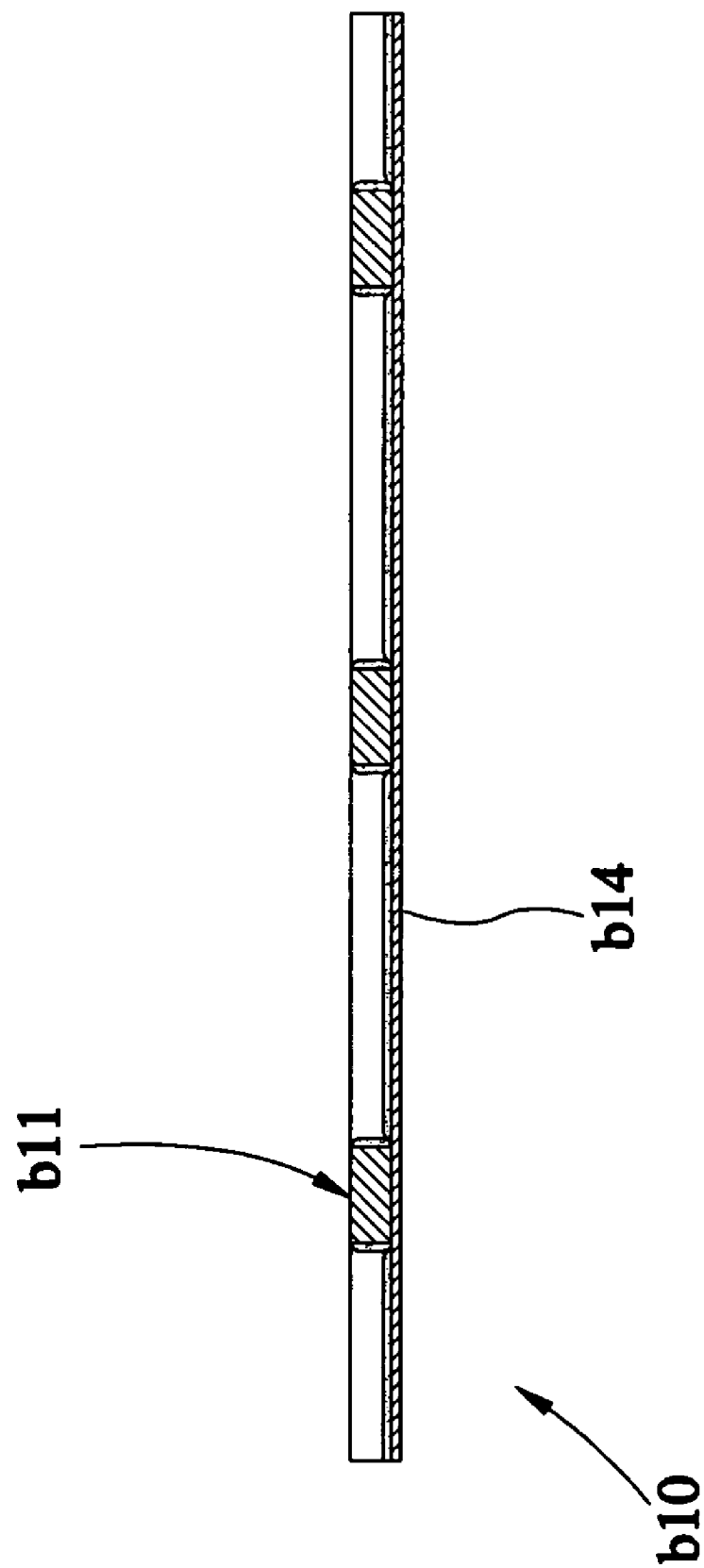
FIG. 22 is a sectional view of a seventh preferred embodiment of the present invention.

Referring to FIG. 22, an ultra-thin liquid control plate b10 constructed according to a seventh preferred embodiment of the present invention is similar to the sixth embodiment but different by that a film b14, like polymeric film or amorphous carbon film, is further mounted on the plate-like member b11 and covered onto the view holes, wherein one side of the film b14 that closely contacts the plate-like member b11 is hydrophilic. Thus, the seventh embodiment further has one more film b14 than the sixth embodiment for adsorbing the liquid layer, further providing an additional support for fastening the cell specimen and facilitating formation of its nutrient liquid layer. The other operations of the seventh embodiment, such as adsorption of the liquid layer for cooperation with the operation of the electron microscope, are the same as those of the sixth embodiment, such that no further recitation is necessary.

Figure 23:
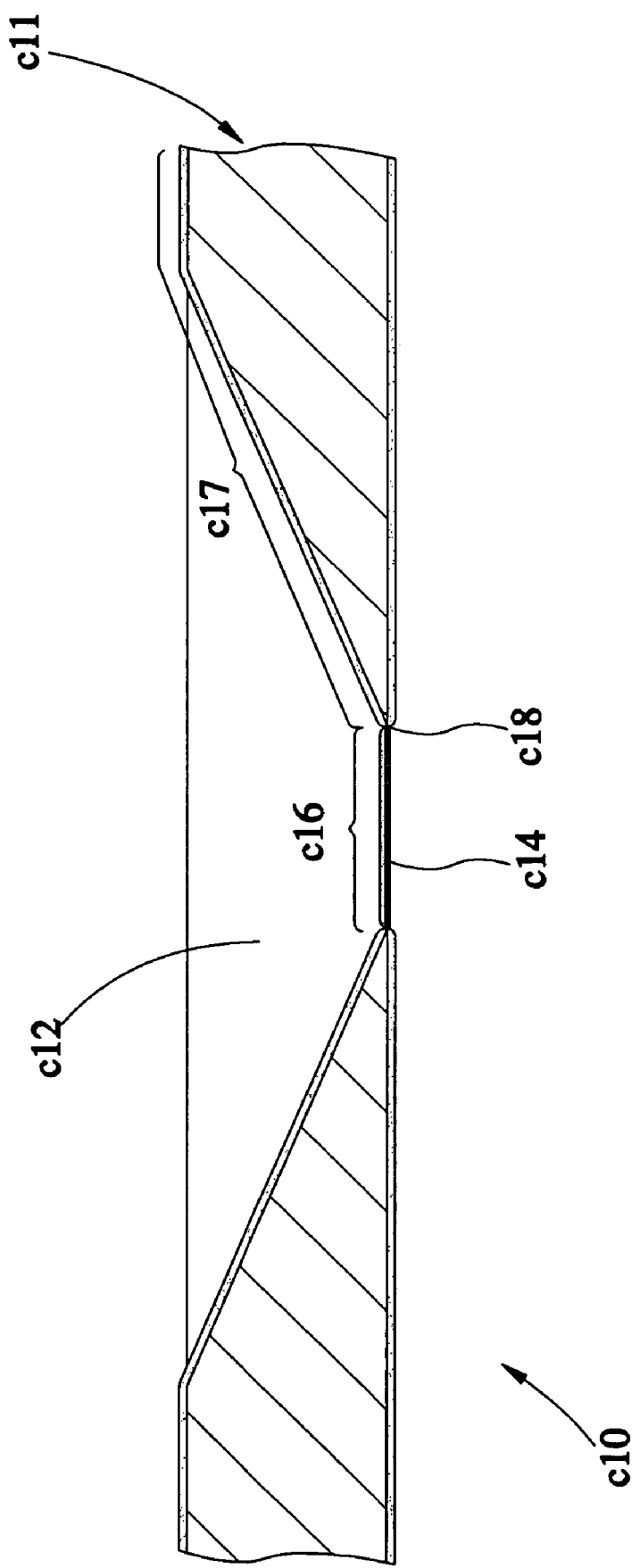
FIG. 23 is an enlarged schematic view of a part of an eighth preferred embodiment of the present invention.

Referring to FIG. 23, an ultra-thin liquid control plate c10 constructed according to an eighth preferred embodiment of the present invention includes a plate-like member c11 having at least one view hole c12 and a film c14 mounted at a bottom end of the view hole c12. The surface of the plate-like member c11, the surface of the sidewall of the view hole c12, and the surface of the film c14 are incorporated to form a joint surface defining at least one first section c16 and at least one second section c17. The first and second sections c16 and c17 are adjacent to each other, having a border c18 defined therebetween. The first section c16 is more hydrophilic than the second section c17. In this embodiment, the first section c16 is coated with a hydrophilic material to become hydrophilic, and the second section c17 is coated with a hydrophobic or super-hydrophobic material to become hydrophobic not to adsorb liquid and to be less hydrophilic than the first section c16.

Figure 24:
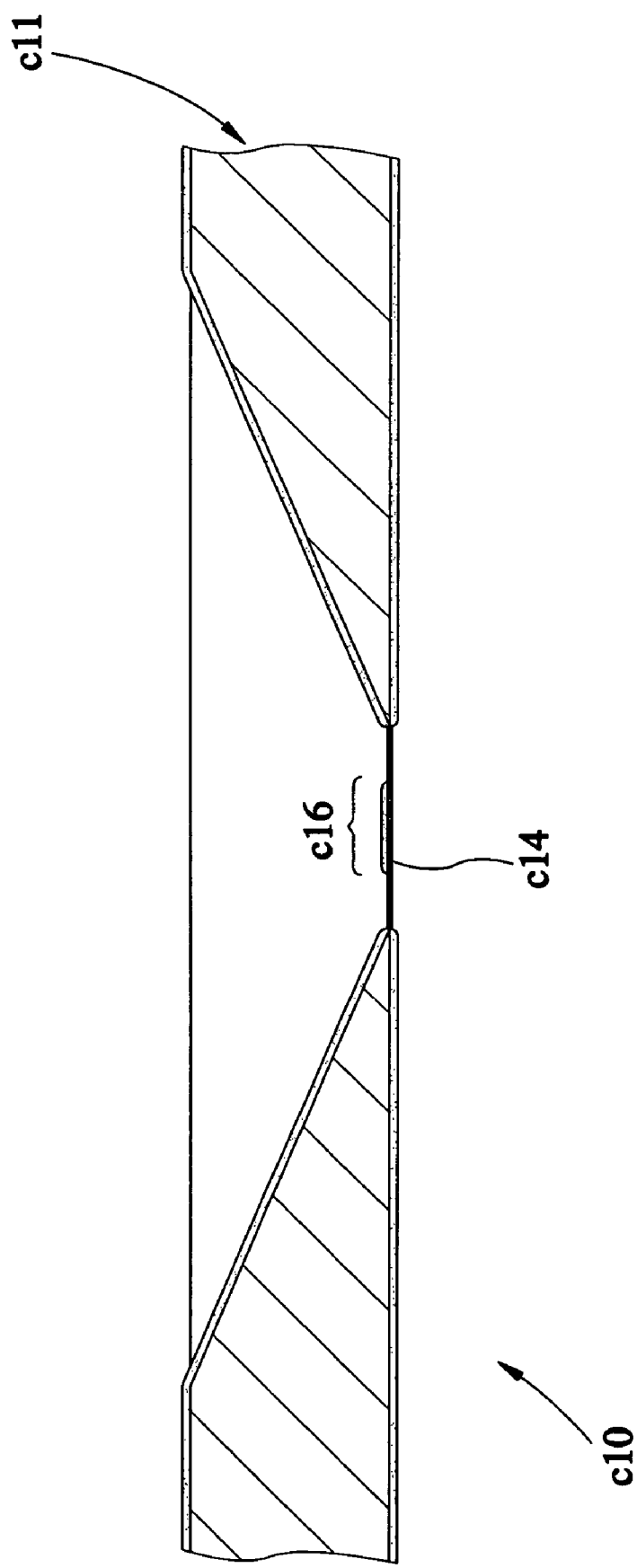
FIG. 24 is another enlarged schematic view of a part of the eighth preferred embodiment of the present invention, illustrating that the part is partially hydrophilic.
Figure 25:
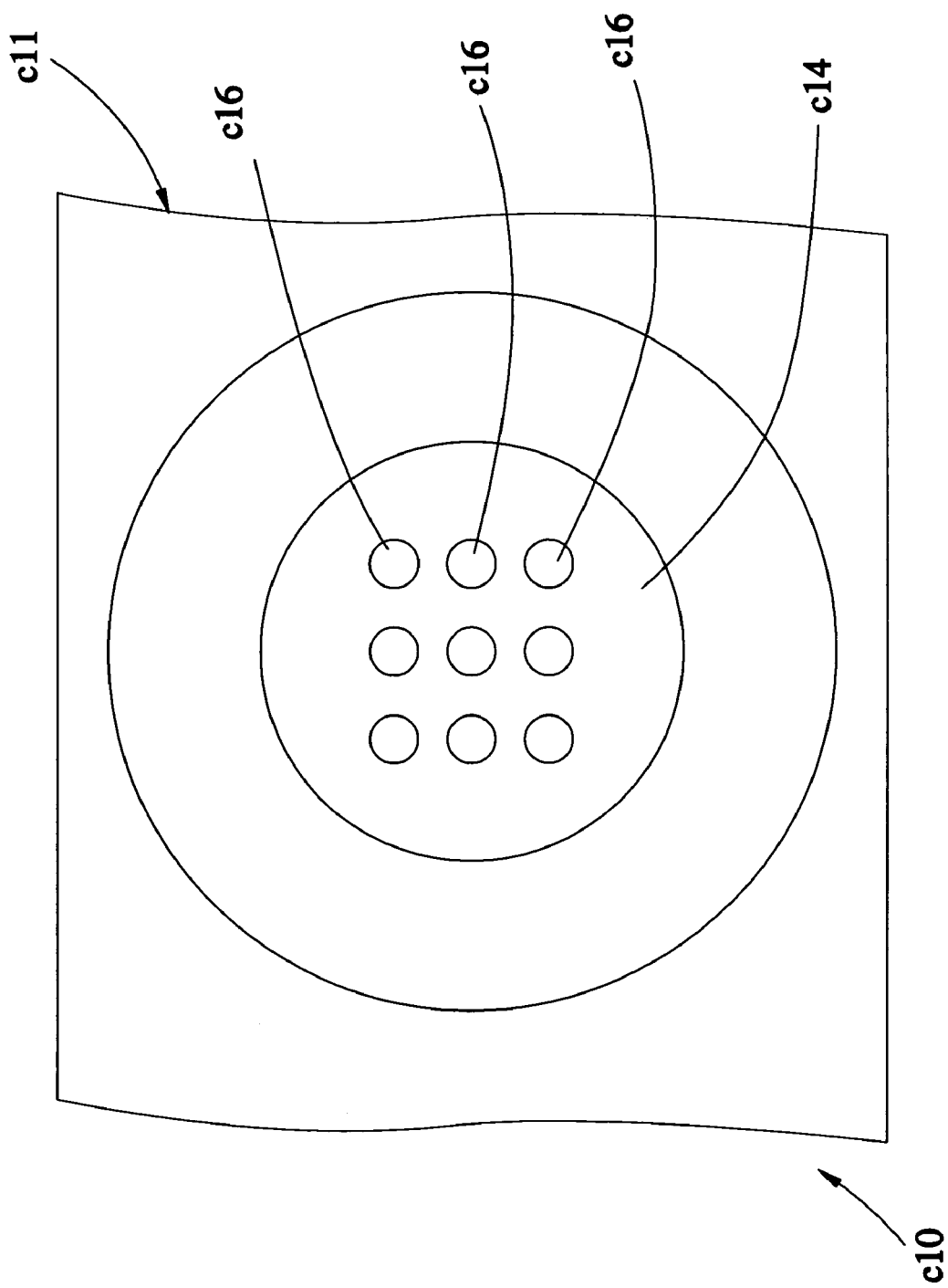
FIG. 25 is another enlarged schematic view of a part of the eighth preferred embodiment of the present invention, illustrating that a first section is disposed in array in the film.
Figure 26:
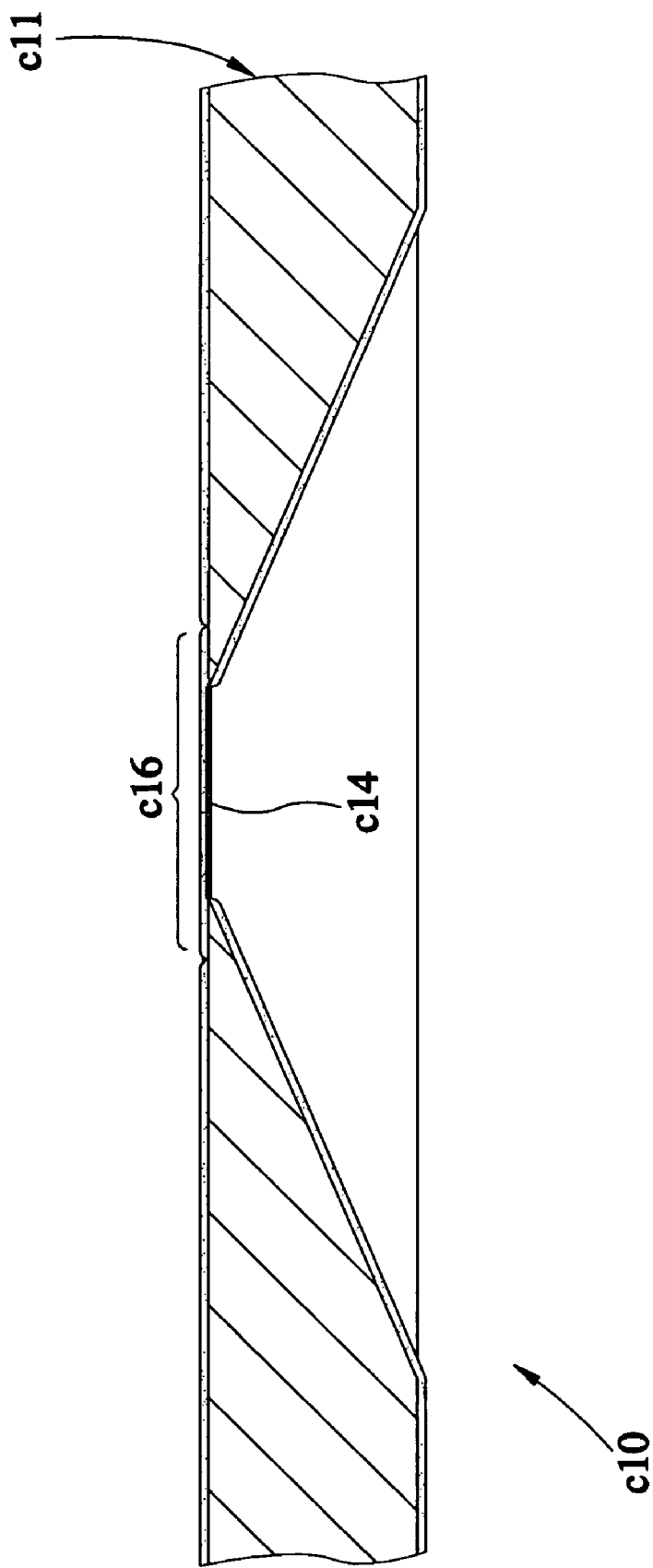
FIG. 26 is another enlarged schematic view of a part of the eighth preferred embodiment of the present invention, illustrating that the first section overlaps the film and a part of the surface of the plate-like member.

In light of the above structure, the film c14 adsorbs liquid through the first section c16 to form a liquid layer, which is primarily adsorbed onto the first section c16 because of different hydrophilic degree provided at two sides of the border c18. In this embodiment, the first section c16 is formed on the whole surface of the top side of the film c14, and the second section c17 is defined together by the surfaces of the plate-like member c11 and the sidewall of the view hole c12 to encompass the first section c16. Alternatively, the first section c16 can be formed on a part of the surface of the top side of the film c14, as shown in FIG. 24. Further, there alternatively are a plurality of the first sections c16 disposed in array on the top side of the film c14, as shown in FIG. 25. Further, the first section c16 can alternatively be formed on a surface incorporated by those of the film c14 and the plate-like member c11, as shown in FIG. 26. Further, the first section c16 can be alternatively the bottom side of the film to adsorb the liquid; because the liquid layer adsorbed is ultra-thin, the liquid layer will not be too heavy to be adsorbed.

Figure 27:
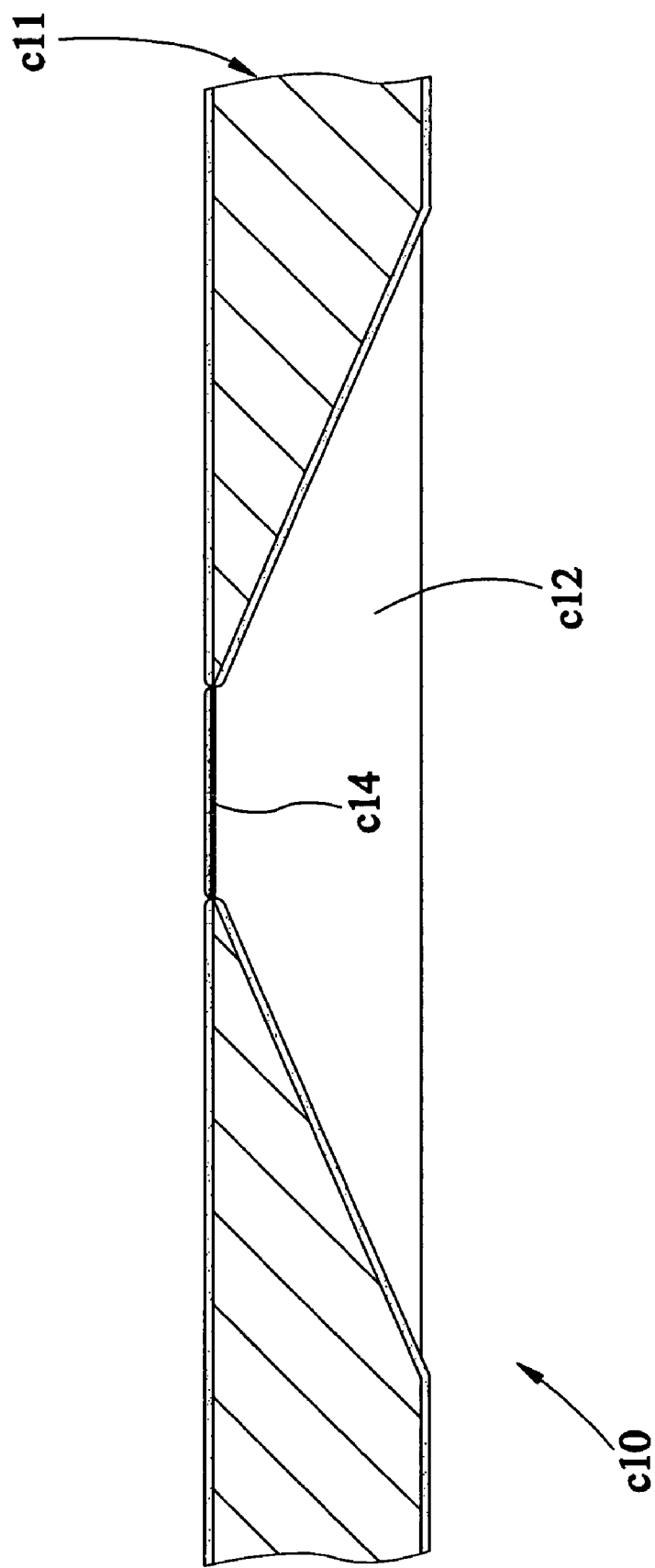
FIG. 27 is another enlarged schematic view of a part of the eighth preferred embodiment of the present invention, illustrating that the film is disposed at a top side of the view hole.
Figure 28:
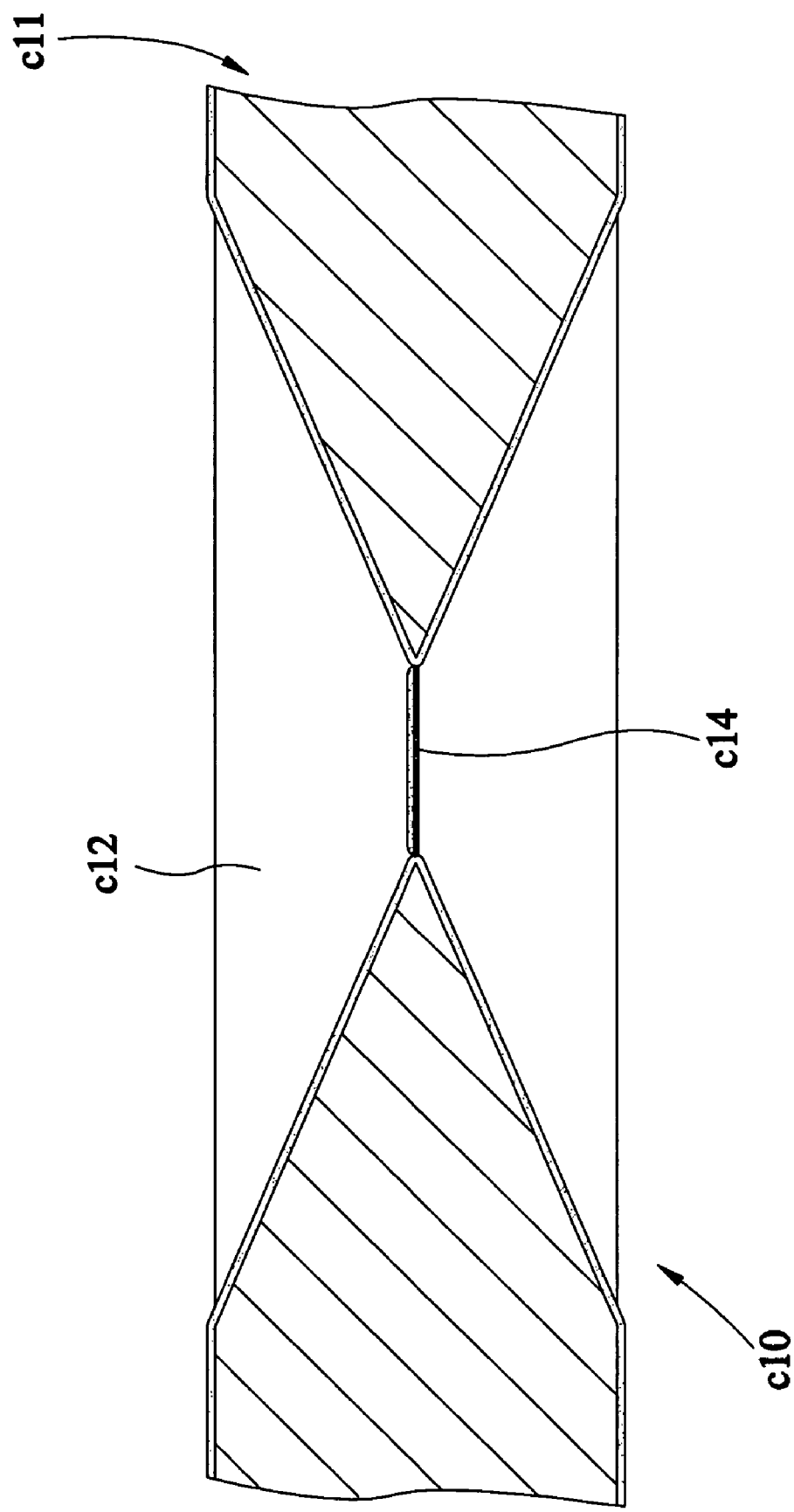
FIG. 28 is another enlarged schematic view of a part of the eighth preferred embodiment of the present invention, illustrating that the film is disposed at a sidewall of the view hole.

Referring to FIG. 27, the film c14 can be alternatively mounted onto the top side of the view hole c12, adsorbing the liquid layer through a hydrophilic top side thereof. The plate-like member c11 does not adsorb any liquid because its surface is less hydrophilic. Referring to FIG. 28, the film c14 can be alternatively mounted onto the sidewall of the view hole c12 to be located at a midsection in the view hole c12; in other words, where the film c14 is located is not limited to the top side of the view hole c12.

The other operations of the eighth embodiment, such as adsorption of the liquid layer for cooperation with the operation of the electron microscope, are the same as those of the first embodiment, such that no further recitation is necessary.

In addition to combination with the box-like member as mentioned in the aforementioned embodiments, the plate-like member c11 of the eighth embodiment can be alternatively provided with a plurality of the view holes, which operation is the same as that of the aforementioned embodiments such that no further description is necessary.

As indicated above, the present invention includes advantages as follows:

1. The ultra-thin liquid layer is available: The technical disclosure of the present invention enables the formation of the ultra-thin layer on the plate-like member in a very simple manner. The ultra-thin liquid layer, under a suitable observational environment, can enable observation under the microscope.
2. The box-like member is applied to the present invention to facilitate the observation: The present invention combined with the box-like member provides a better observational environment and an ultra-thin gas-controlled environment can be generated around the ultra-thin liquid control plate for cooperation with the observation under the electron microscope.

Although the present invention has been described with respect to specific preferred embodiments thereof, it is no way limited to the details of the illustrated structures but changes and modifications may be made within the scope of the appended claims.

What is claimed is:

1. An ultra-thin liquid control plate for an electron microscope, comprising a plate-like member, said plate-like member having at least one view hole, said view hole having a sidewall formed of an upper section and a lower section at least, wherein one of said upper and lower sections of said sidewall is more hydrophilic than the other and is smaller than 50 µm height, whereby after a liquid is infused into said view hole, the more hydrophilic one of the two sections adsorbs the liquid to form a liquid layer and the other section is less hydrophilic to adsorb none of the liquid.

2. The ultra-thin liquid control plate as defined in claim 1, wherein the sidewall of said view hole is taper-shaped to have a large diameter and a small diameter at two ends respectively, wherein said more hydrophilic section of said sidewall is close to the small-diameter end; or said sidewall of said view hole is stepped in shape.

3. The ultra-thin liquid control plate as defined in claim 2, wherein said more hydrophilic section of said sidewall of said view hole is coated with a hydrophilic layer to be hydrophilic, and the other section is coated with a hydrophobic or super-hydrophobic material to be hydrophobic.

4. The ultra-thin liquid control plate as defined in claim 1, wherein said sidewall of said view hole is formed of an upper section, a middle section, and a lower section, said middle section being hydrophilic, said upper and lower sections being hydrophobic.

5. The ultra-thin liquid control plate as defined in claim 4, wherein said plate-like member is formed of two hydrophobic layers and a hydrophilic layer tightly mounted between said two hydrophobic layers, said hydrophilic layer being made of hydrophilic material to be hydrophilic, each of said two hydrophobic layers is made of hydrophobic material to be hydrophobic.

6. The ultra-thin liquid control plate as defined in claim 4, wherein said sidewall of said view hole is column-shaped or hourglass-shaped.

7. The ultra-thin liquid control plate as defined in claim 1, wherein said plate-like member has two hydrophobic end surfaces which are less hydrophilic.

8. The ultra-thin liquid control plate as defined in claim 1, wherein said plate-like member comprises at least one liquid control tubing in communication with said view hole.

9. The ultra-thin liquid control plate as defined in claim 1, wherein said view hole is mounted with a film at an end thereof abutting said more hydrophilic section thereof.

10. The ultra-thin liquid control plate as defined in claim 1, wherein said view hole has a diameter smaller than 500 µm.

11. An ultra-thin liquid control plate and a combination of a box-like member and the control plate, comprising:
   a box-like member having at least one through hole running through each of a top side and a bottom side thereof; and
   a plate-like member mounted inside said box-like member and having at least one view hole, said view hole having a sidewall formed of an upper section and a lower section at least;
   wherein one of said upper and lower sections is hydrophobic, and the other is hydrophilic and provided with a height smaller than 50 µm; said through holes are coaxially aligned with said view hole.

12. The ultra-thin liquid control plate as defined in claim 11, wherein said box-like member and said plate-like member are formed or combined in one piece and said plate-like member is located at a midsection inside said box-like member.

13. The ultra-thin liquid control plate as defined in claim 11, wherein at least one of said two through holes is sealed with a film.

14. An ultra-thin liquid control plate for an electron microscope, comprising a plate-like member having a plurality of view holes, wherein each of said view holes has a hydrophilic sidewall which height is smaller than 50 μm.

15. The ultra-thin liquid control plate as defined in claim 14, wherein said plate-like member is a meshed plate.

16. The ultra-thin liquid control plate as defined in claim 15, wherein said plate-like member comprise a plurality of strips intersected with one another to form said view holes, said sidewalls of said view holes being defined by lateral sides of said strips, top and bottom sides of said strips being hydrophobic or super-hydrophobic to adsorb no liquid.

17. The ultra-thin liquid control plate as defined in claim 14 further comprising a film closely mounted on said plate-like member and covered onto said view holes, wherein one side of said film that closely contacts said plate-like member is hydrophilic.

* * * * *